United States Patent [19]
Richart et al.

[11] Patent Number: 5,717,632
[45] Date of Patent: Feb. 10, 1998

[54] APPARATUS AND METHOD FOR MULTIPLE-LEVEL STORAGE IN NON-VOLATILE MEMORIES

[75] Inventors: Robert B. Richart; Shyam Garg, both of Austin, Tex.

[73] Assignee: Advanced Micro Devices, Inc., Sunnyvale, Calif.

[21] Appl. No.: 757,988

[22] Filed: Nov. 27, 1996

[51] Int. Cl.[6] ................................................ G11C 11/34
[52] U.S. Cl. ...................... 365/185.2; 365/185.01; 365/185.03; 365/185.24
[58] Field of Search ...................... 365/185.2, 185.03, 365/185.01, 185.24

[56] References Cited

U.S. PATENT DOCUMENTS

| | | | |
|---|---|---|---|
| 5,596,527 | 1/1997 | Tomioka et al. | 365/185.2 |
| 5,619,452 | 4/1997 | Miyauchi | 365/185.2 |

OTHER PUBLICATIONS

M. Bauer, et al. "A Multilevel-Cell 32Mb Flash Memory", 1995 IEE International Solid State Circuits Conference, Feb. 16, 1995, pp. 132–133.

K. Yoshikawa, "Impact of Cell Threshold Voltage Distribution in the Array of Flash Memories on Scaled and Multilevel Flash Cell Design", 1996 Symposium on VLSI Technology Digest of Technical Papers, , IEEE, 1996, pp. 240–241.

*Primary Examiner*—David C. Nelms
*Assistant Examiner*—F. Niranjan

*Attorney, Agent, or Firm*—Skjerven, Morrill, MacPherson, Franklin & Friel LLP; Ken J. Koestner

[57] ABSTRACT

A storage control circuit determines a programmed threshold voltage $V_{tP}$ of a storage cell in which the transistor threshold voltages $V_{tT}$ of the cell may overlap while the logical threshold voltages $V_{tL}$ remain distinct. In one embodiment, sixteen distinctive levels are stored in a storage cell within a 2.5 V range so that a single memory cell supplies four bits of information storage per cell, quadrupling the memory capacity per cell as compared to conventional single-bit storage cells. In an embodiment, a nonvolatile memory circuit includes a nonvolatile memory array with a plurality of memory cells and a plurality of decoders connected to the nonvolatile memory array. The plurality of decoders decode addresses to the nonvolatile memory array. The nonvolatile memory circuit also includes a voltage controller connected to the nonvolatile memory array, a programming controller connected to the plurality of decoders and connected to the voltage controller, a plurality of sense amplifier and reference cells connected to the plurality of decoders for sensing a memory cell at a selected memory cell address of the plurality of memory cells in the nonvolatile memory array and connected to the programming controller for receiving the sensing mode signal, and a level conversion circuit having input terminals connected to the plurality of sense amplifier and reference cells and having an output terminal connected to the programming controller for communicating a level feedback signal. The voltage controller controls a programming voltage amplitude applied to the nonvolatile memory array. The programming controller selects a memory cell address, a nonvolatile memory array programming voltage amplitude, and a sensing mode signal.

26 Claims, 16 Drawing Sheets

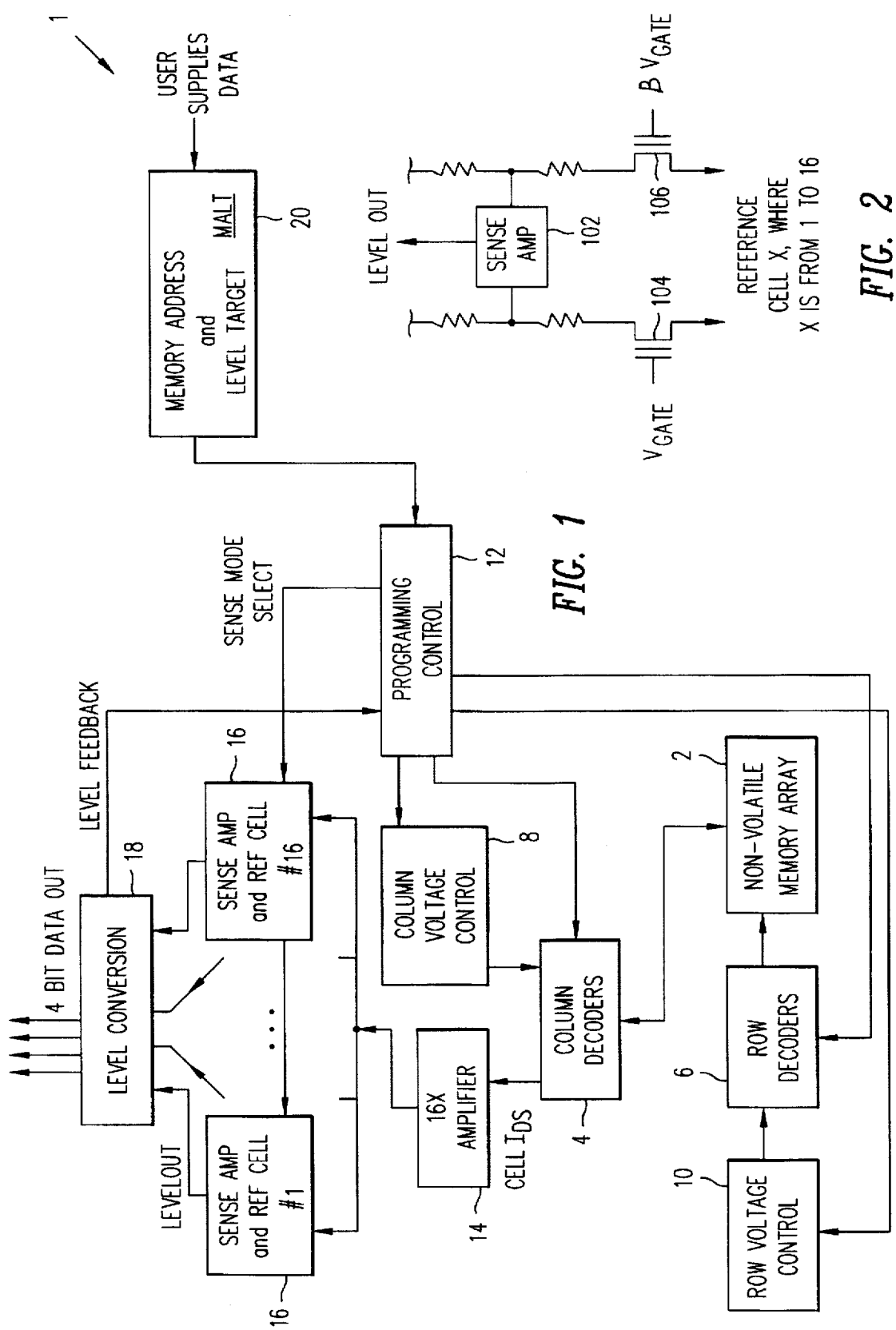

Key To

APPARATUS AND METHOD FOR MULTIPLE-LEVEL STORAGE IN NON-VOLATILE MEMORIES

CROSS REFERENCE TO RELATED PATENT APPLICATIONS

This patent application is related to copending U.S. patent application entitled "An Electrically Erasable Reference Cell for Accurately Determining Threshold Voltage of a Non-volatile Memory at a Plurality of Threshold Voltage Levels" by Robert B. Richart and Shyam Garg Ser. No. 08/757,987, and having the same fling date as this application, the disclosure of which is incorporated herein by reference in its entirety.

This patent application is also related to U.S. patent application Ser. No. 08/432,623, entitled "Method for Reading a Non-Volatile Memory Array", Robert B. Richart, Nipendra J. Patel and Shyam G. Garg, filed May 2, 1995, which is hereby incorporated by reference in its entirety.

BACKGROUND OF THE INVENTION

1. Field of the Invention

The present invention relates to memory storage devices and systems. More particularly, the present invention relates to a storage control circuit and operating method for storing multiple levels per memory cell, thereby supplying storage of multiple data bits in a single memory cell.

2. Description of the Related Art

Nonvolatile memories including electrically programmable read-only memories (EPROM), electrically-erasable programmable read only memories (EEPROM), and FLASH memories store information by setting individual cells within a memory array to selected threshold voltages ($V_T$). Two threshold voltages are defined so that data is set to a binary value of "0" or "1". Data integrity is established through monitoring of the threshold voltage of the individual cells since data loss occurs in the case of shifts in $V_T$.

A bit in nonvolatile memory is accessed or monitored using one of two techniques for monitoring the threshold voltage ($V_T$) of a storage cell. In a first technique, a storage cell is directly accessed, measurements of drain-to-source current ($I_{DS}$) and gate voltage ($V_G$) are performed, and threshold voltage ($V_T$) is calculated. The direct measurement technique has several drawbacks. First, accuracy of the $V_T$ measurement is poor due to a lack of amplification of the current ($I_{DS}$) and voltage ($V_G$) signals. Second, the $V_T$ measurement accuracy is degraded due to disturbance of the $V_T$ signal during the long access times which are necessary for measuring the current ($I_{DS}$).

In a second technique, a storage cell is accessed using an on-chip differential amplifier. Several advantages are gained using a differential amplifier measurement. First, amplification magnifies the voltage scale so that fine distinctions in the $V_T$ signal are resolved. Second, the differential amplifier technique is performed with a fast-access measurement, typically 45 ns or faster, so that the measurement does not disturb the $V_T$ signal of the measured bit.

One advantage of the monitoring technique using a differential amplifier is that such a technique allows a single memory cell of nonvolatile memory to designate multiple levels of data, thereby increasing the amount of storage possible in a single cell. Multilevel flash memories have been shown to double storage capacity without substantially changing device dimensions. M. Bauer et al. in "A Multilevel-Cell 32 Mb Flash Memory", 1995 IEEE International Solid-State Circuits Conference, P. 132, discloses a circuit and technique for multilevel cell storage to double memory density storage. This improvement in storage capacity is possible only if the distributions of threshold voltages $V_T$ are sufficiently separated to avoid read errors. Unfortunately, widely spread distributions in threshold voltage $V_T$ have heretofore been possible only through the usage of higher programming voltages. The higher programming voltages and resulting higher threshold voltages $V_T$ place a larger electric field across the oxides during storage. Therefore at programming voltages that are suitable for standard computers, signal processors, data processors and the like, a maximum of four levels of storage has been achieved using the conventional approach of Bauer et al.

What is needed is a circuit and operating method that makes further advances in memory density storage possible.

SUMMARY OF THE INVENTION

In accordance with the present invention, a storage control circuit employs a novel technique for determining a programmed threshold voltage $V_{tP}$ of a storage cell in which the transistor threshold voltages $V_{tT}$ of the cell may overlap while the logical threshold voltages $V_{tL}$ remain distinct.

In accordance with one embodiment of the present invention, sixteen distinctive levels are stored in a storage cell within a 2.5 V range so that a single memory cell supplies four bits of information storage per cell, quadrupling the memory capacity per cell as compared to conventional single-bit storage cells.

In accordance with an embodiment of the present invention, a nonvolatile memory circuit includes a nonvolatile memory array with a plurality of memory cells and a plurality of decoders connected to the nonvolatile memory array. The plurality of decoders decode addresses to the nonvolatile memory array. The nonvolatile memory circuit also includes a voltage controller connected to the nonvolatile memory array, a programming controller connected to the plurality of decoders and connected to the voltage controller, a sense amplifier and reference cell connected to the plurality of decoders for sensing a memory cell at a selected memory cell address of the plurality of memory cells in the nonvolatile memory array and connected to the programming controller for receiving the sensing mode signal, and a level conversion circuit having an input terminal connected to the sense amplifier and reference cell and having an output terminal connected to the programming controller for communicating a level feedback signal. The voltage controller controls a programming voltage amplitude applied to the nonvolatile memory array. The programming controller selects a memory cell address, a nonvolatile memory array programming voltage amplitude, and a sensing mode signal.

In accordance with a further embodiment of the present invention, the sense amplifier and reference cell of the nonvolatile memory circuit further includes a memory cell transistor having a gate connected to a memory cell at a selected memory cell address of the plurality of memory cells in the nonvolatile memory array and a source drain pathway, a reference cell transistor having a gate connected to a reference cell and a source drain pathway, and a sense amplifier having a first input terminal connected to the source drain pathway of the memory cell transistor, a second input terminal connected to the source drain pathway of the reference cell transistor, and an output terminal connected to the level conversion circuit which connects to the programming controller for communicating the level feedback signal. The sense amplifier and reference cell further includes a memory cell at a selected memory cell address of the plurality of memory cells in the nonvolatile memory array.

In accordance with another embodiment of the present invention, a method of programming a nonvolatile memory cell in a nonvolatile memory array includes the steps of programming a plurality of parallel-connected reference cells to a predetermined threshold voltage $V_T$, initializing a nonvolatile memory cell in the nonvolatile memory array into an erased condition, supplying a memory address and data voltage level for programming a nonvolatile memory cell of the nonvolatile memory array, and latching the supplied memory address and data voltage level. The programming method further includes the steps of decoding the latched memory address using row and column decoders, generating a programming pulse at the latched data voltage level for application to a nonvolatile memory cell at the decoded memory address, generating a read pulse for application to the nonvolatile memory cell at the decoded memory address, sensing a source drain current $I_{DS}$ of the nonvolatile memory cell at the decoded memory address, comparing the source drain current $I_{DS}$ of the nonvolatile memory cell at the decoded memory address to a reference cell of the plurality of reference cells connected in parallel, and generating an output level signal as a function of a result of the comparing step for the nonvolatile memory cell at the decoded memory address.

Many advantages are achieved by the described circuit and operating method. Substantial advantages are gained by achieving an increase in the capacity of storage, a reduction in the memory per-bit cost, and a decrease in circuit size for a given memory capacity. The range and accuracy of threshold voltage monitoring is improved. Precise setting of reference cell current is achieved without performing an ultraviolet memory erase operation. The described circuit and operating method also supports repair of bits within a memory that lose charge.

The circuit and method are advantageous for improving the resolution of threshold voltage $V_T$ in a storage cell while sensing within the range of voltages that are normally applied to an integrated circuit. Also, the circuit and method are highly advantageous for programming multiple-level storage cells with a large number of levels, such as 64 or 256 levels.

A capability to erase and reprogram a reference cell is highly advantageous to compensate for programming overshoot in a memory with multiple reference cells. The capability to electrically erase individual reference cells increases the probability of achieving a specified threshold voltage $V_T$ target from approximately 95% to nearly 100%. Without this improvement, a memory having as few as sixteen reference cells with a 95% success rate per cell achieves only a $(0.95)^{16}$=0.44 (44%) success rate per chip. In comparison, a sixteen-reference cell chip using electrically-erasable reference cells attains nearly a 100% success rate per chip.

The usage of electrically erasable reference cells is highly advantageous for improving the yield in manufacturing of memories and for allowing the storage interface usage in combination with memories of different types, models and manufacturers.

BRIEF DESCRIPTION OF THE DRAWINGS

The features of the described embodiments believed to be novel are specifically set forth in the appended claims. However, embodiments of the invention relating to both structure and method of operation, may best be understood by referring to the following description and accompanying drawings.

FIG. 1 is a schematic block diagram illustrating an embodiment of a nonvolatile memory and control circuit for storing sixteen programming voltage levels in a single cell in accordance with the present invention.

FIG. 2 is a schematic circuit diagram showing an embodiment of a sense amplifier/reference cell of the plurality of sense amplifier/reference cells.

FIG. 15 is a schematic block diagram which illustrates a differential amplifier for usage in the storage interface shown in FIG. 7.

DETAILED DESCRIPTION OF THE PREFERRED EMBODIMENTS

Figure 3:
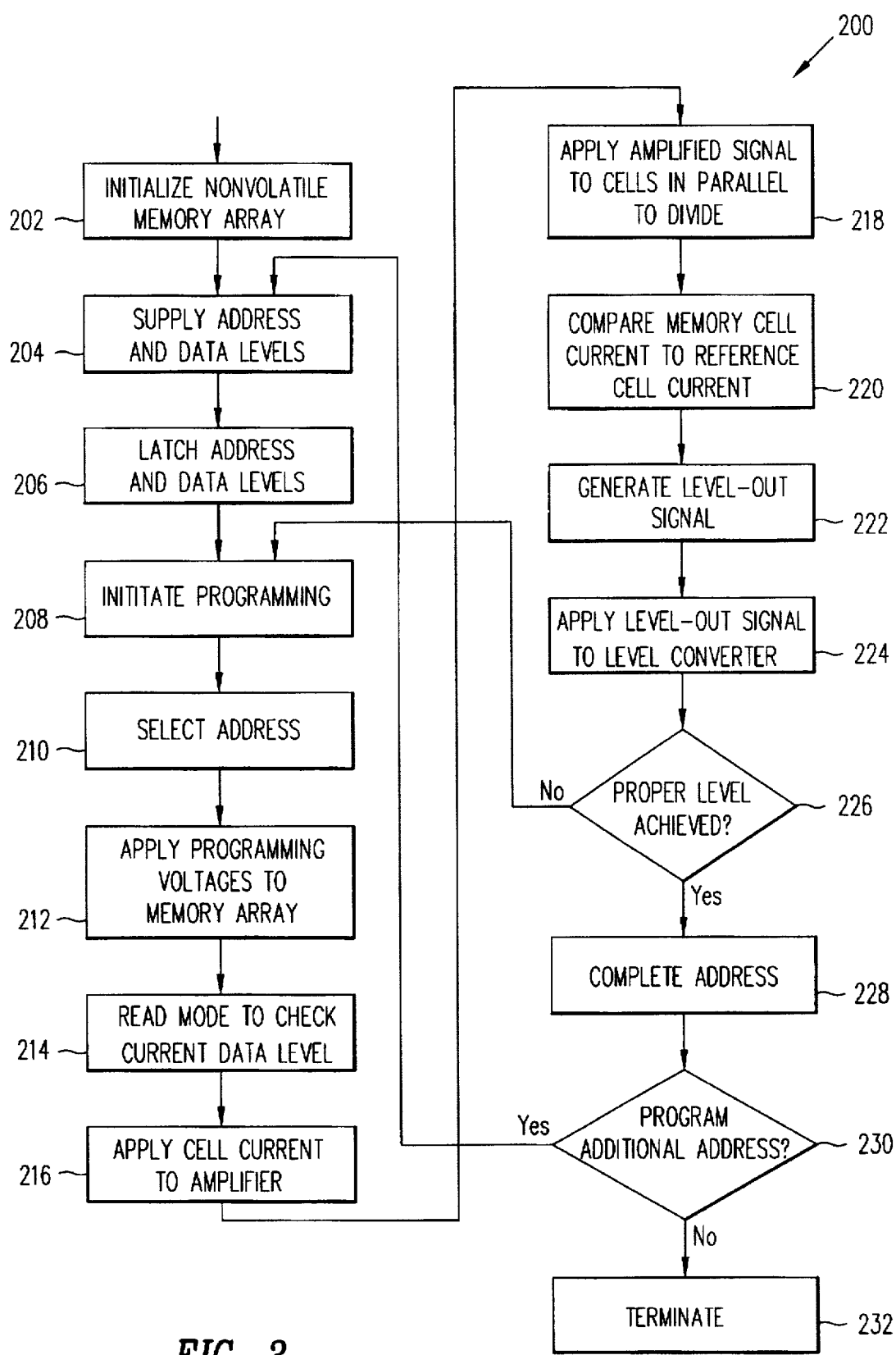
FIG. 3 is a flow chart illustrating an embodiment of a method of operation of the nonvolatile memory and control circuit.

Referring to FIG. 1, a schematic block diagram illustrates an embodiment of a nonvolatile memory and control circuit 1 for storing sixteen programming voltage levels in a single cell. The nonvolatile memory and control circuit 1 includes a nonvolatile memory array 2 having a conventional row and column memory structure that is accessed using column decoders 4 and row decoders 6. The column decoders 4 and the row decoders 6 respectively generate column and row addressing signals for addressing individual storage cells (not shown) of the nonvolatile memory array 2. Programming voltages are applied to the nonvolatile memory array 2 using a column voltage controller 8 and a row voltage controller 10. A column voltage control signal is applied to the nonvolatile memory array 2 via the column decoders 4. A row voltage control signal is applied to the nonvolatile memory array 2 via the row decoders 6. The column voltage controller 8, column decoders 4, row voltage controller 10 and row decoders 6 receive control signals from a programming controller 12 to control column and row addressing and programming voltage levels.

A drain-to-source current $I_{DS}$ of the individual memory cells (not shown) in the nonvolatile memory array 2 is measured and connected through the column decoders 4 to an amplifier circuit 14. In the illustrative embodiment, the amplifier circuit 14 is a 16x amplifier. The cell $I_{DS}$ is applied from the amplifier circuit 14 to a plurality of sense amplifier/reference cells 16 which are connected in parallel. In the illustrative embodiment, the amplifier circuit 14 is connected to sixteen sense amplifier/reference cells 16 with a single signal level associated to each reference cell. The sense amplifier/reference cells 16 compare the cell current $I_{DS}$ to a reference cell where a reference cell is programmed to a selected threshold voltage $V_T$. The sense amplifier/reference cells 16 generate a plurality of output level signals which are applied to a level converter 18. The sense amplifier/reference cells 16 are connected to the programming controller 12 to receive a sense mode select signal for controlling the operation of the sense amplifier/reference cells 16. An output level feedback signal is connected from the level converter 18 to the programming controller 12.

The nonvolatile memory and control circuit 1 interfaces to external circuits such as a processor via a memory interface 20. The memory interface 20 receives memory address, level target information and data from the external circuits during a memory write operation and supplies data to the external circuits during a memory read operation.

Referring to FIG. 2, a schematic circuit diagram illustrates an embodiment of a sense amplifier/reference cell of the plurality of sense amplifier/reference cells 16. The sense amplifier/reference cell 16 includes a sense amplifier 102 and a pair of transistors, specifically a memory cell 104 and a reference cell 106. The memory cell 104 is depicted as an "equivalent" circuit representation in which the memory cell current $I_{DS}$ signal is multiplied by the amplifier circuit 14 and divided by feeding the amplified signal to the plurality of sense amplifier/reference cells 16 in parallel. The reference cell 106 is one cell of the plurality of reference cells in the plurality of sense amplifier/reference cells 16. The reference cells 106 are electrically programmable and erasable so that a precise threshold voltage $V_T$ is established in the individual reference cells of the nonvolatile memory and control circuit 1.

The memory cell transistor 104 is connected to an input terminal of the sense amplifier 102 to supply one-sixteenth of a 16X signal from the 16X amplifier circuit 14. Accordingly, the amplifier circuit 14 feeds a signal amplified sixteen times to sixteen individual sense amplifiers 102. The memory cell transistor 104 of the transistor pair has a gate terminal connected to the row voltage controller 10 via the row decoders 6 and a source-drain pathway connected to a first input terminal of the sense amplifier 102. A reference cell transistor 106 of the transistor pair has a gate terminal connected to the sense mode select signal line of the programming controller 12 and a source-drain pathway connected to a second input terminal of the sense amplifier 102. The sense amplifier 102 is a differential amplifier which compares the signal supplied from the amplifier circuit 14 to the $I_{DS}$ signal supplied from the reference cell transistor 106 and generates a difference signal, called a "level out" signal. A fraction B of the gate voltage of the memory cell transistor 104 is applied to the reference cell transistor 106 via the programming controller 12. The memory cell transistor 104 has a transistor threshold voltage $V_{TM}$ and the reference cell transistor 106 has a transistor threshold voltage $V_{TR}$. The nonvolatile memory and control circuit 1 is a multi-level storage in a nonvolatile memory for increasing storage density in a memory cell.

In one embodiment, a nonvolatile memory having a storage capacity of 64M bit can be produced using a conventional 16M bit NOR stacked-gate technology memory in combination with the nonvolatile memory and control circuit 1 shown in FIG. 1 and the associated operating method. The long-term feasibility of the multilevel memory has been shown using a ten-year equivalent data retention bake test.

Referring to FIG. 3 in conjunction with FIG. 1, a flow chart illustrates an embodiment of a method of operation 200 of the nonvolatile memory and control circuit 1. At initialization 202, the nonvolatile memory array 2 begins in an erased or over-erased condition, either through ultraviolet erasure or electrical erasure. In some embodiments, column leakage in the nonvolatile memory array 2 is suppressed using the technique expressed in U.S. patent application Ser. No. 08/432,623, entitled "Method for Reading a Non-Volatile Memory Array", Robert B. Richart, Nipendra J. Patel and Shyam G. Garg, filed May 2, 1995, which is hereby incorporated by reference in its entirety. In accordance with this method, the nonvolatile memory array 2 has a plurality of single transistor memory cells. Each memory cell includes a word line and a bit line, or multiple bits lines in the case of a virtual ground nonvolatile memory device. Each nonvolatile memory cell is defined to contain either a virtual ground or a non-virtual ground memory device. A positive voltage is applied to a word line of a memory cell of interest—the active memory cell to be read. A negative voltage is applied to a word line of a memory cell not-of-interest—the inactive memory cell that is not to be read. The memory cells of interest are those cells selected for read. The cells not of interest are connected to the bit line or lines of a cell of interest but are held in an inactive state.

The described method of reading a nonvolatile memory minimizes bit line leakage during a read cycle of a nonvolatile memory array. The method includes the steps of supplying an array of single transistor programmable read-only memory cells. Each single transistor cell includes a control gate connected to a word line and a drain connected to a bit line. A series of drains associated with respective single transistor cells are connected to a bit line conductor. Respective control gates associated with the bit line-connected series of single transistor cells are connected to respective word line conductors. A voltage exceeding turn-on threshold is applied to one cell, a read cell, of the bit line-connected series of single transistor cells. A negative voltage less than turn-on threshold is applied to all cells other than the read cell of the bit line-connected series of single transistor cells.

The method of operating the non-volatile memory includes a technique for programming, erasing and reading a bit within an array of single transistor programmable read-only memory cells. The method is practiced with respect to a single transistor nonvolatile memory cell which includes a channel arranged between a source and a drain. The source and drain may be virtual in the sense of virtual-ground nonvolatile memories. The memory also includes a floating gate which is insulatively spaced between the channel region and the control gate. A word-line is connected to the control gate and a bit-line is connected to the drain. A negative charge is programmed on the floating gate by applying a first positive voltage to the control gate and a second positive voltage to the drain. The second positive voltage is less than the first positive voltage. A negative charge on the floating gate is erased by applying a first negative or ground voltage to the control gate and a third positive voltage upon the source. The programming and erasing steps are repeated over time to eventually cause a net positive charge on the floating gate. The unselected single transistor nonvolatile memory cells are inactive during reading of the bit-line voltage of the respective drain. The inactive single transistor is formed by applying a negative voltage to the respective control gate. The negative charge is selected to be a negative voltage magnitude thereby disallowing inversion of the channel region insulatively spaced beneath a net positively charged floating gate.

In some embodiments, the memory array cells are optionally and intentionally over-erased so that the access speed and access time are improved.

A user supplies memory addresses and data levels in step 204 and the memory addresses and data levels are latched into the memory interface 20 in step 206. The latched addresses and data levels activate the programming controller 12 to initiate programming of the nonvolatile memory and control circuit 1 in step 208.

The programming controller 12 selects an address 210 using the row decoders 6 and the column decoders 4 and directs the row voltage controller 10 and the column voltage controller 8 to apply programming voltages 211 of a selected amplitude, thereby generating a programming pulse.

The programming controller 12 then places voltages into a read mode to check the current data level 214 at the selected address. The cell current $I_{DS}$ from a memory cell at the selected address is applied from the column decoders 4 to the amplifier circuit 14 in step 216. The amplified output is divided by sixteen by feeding the amplified cell current $I_{DS}$ signal to sixteen sense amplifier/reference cells 16 in parallel in step 218.

Each sense amplifier/reference cell of the sense amplifier/reference cells 16 compares the memory cell current to a reference cell current in step 220. The reference cells are previously programmed and tuned to achieve a plurality of different threshold voltage $V_T$ levels. The individual sense amplifier/reference cells 16 determines whether the threshold voltage $V_T$ of the selected memory cell is above or below the reference cell level and generates a 'level out' signal 222 as directed by the determination.

The sixteen 'level out' results are applied to the level converter 18 which generates a four-bit data output result 224 during memory read operations and also generates a level feedback signal for application to the programming controller 12.

The programming controller 12 controls programming and reading of the memory cell in the nonvolatile memory array 2 until the memory cell reaches the desired state supplied by the memory interface 20.

Although FIGS. 1 and 3 depict a sixteen-level, four-bit memory cell structure, other numbers of levels and bits may also be employed. The nonvolatile memory and control circuit 1 is highly parallel in structure so that other level and bit memory sizes may be utilized. For example, in other embodiments x8, x16, and x32 nonvolatile memories utilize the illustrative process applied to 8, 16 and 32 bits simultaneously.

Figure 5:
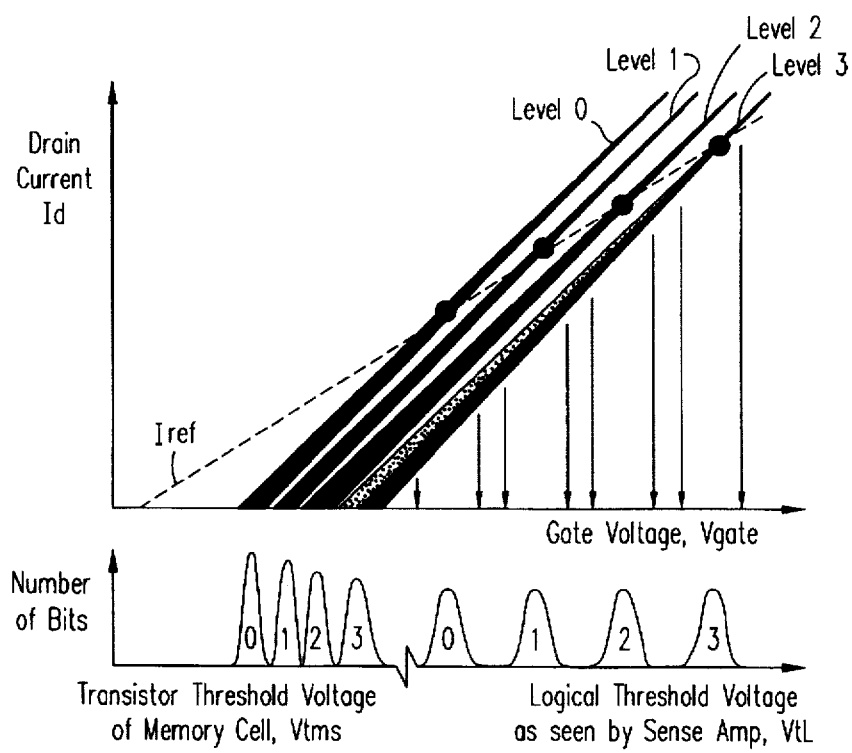
FIG. 5 is a graph showing four distinct levels as seen by the sense amplifier in which the threshold voltages may overlap when transconductance variations are considered.

In a conventional multilevel memory operation, the multiple levels are distinguished by distinct threshold voltage $V_T$ values for each level. Unfortunately, due to variations in transconductance $g_M$ the transistor threshold voltage of a memory cell $V_{TM}$ has a distribution which is spread over a range of gate voltage levels so that the memory cell threshold voltages $V_{TM}$ are not well separated and may overlap as is shown in FIG. 5.

Figure 4:
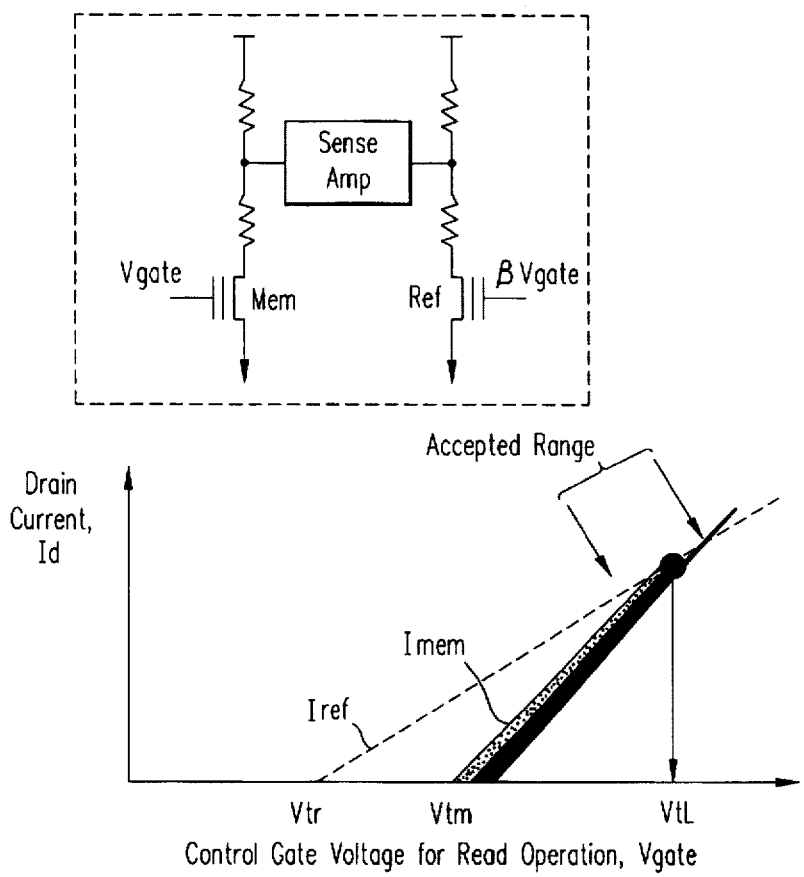
FIG. 4 is a graph which illustrates the definition of a logical threshold voltage $V_{TL}$ as seen by a sense amplifier where a fraction of the memory cell gate voltage is applied to a reference cell.

The nonvolatile memory and control circuit 1 uses a novel technique to distinguish a plurality of threshold voltage $V_T$ levels in a multilevel memory. In particular, the sense amplifier/reference cell 16 shown in FIG. 2 is controlled to determine a logical threshold voltage $V_{TL}$. The logical threshold voltage $V_{TL}$ is the gate voltage at which the reference cell current $I_{REF}$ and the memory cell current $I_{MEM}$ are equal, as is shown in FIG. 4. While the memory cell threshold voltages $V_{TM}$ may overlap and be indistinguishable, the logical threshold voltages $V_{TL}$ remain distinct and easily distinguishable, as is shown in FIG. 5, because the logical threshold voltage $V_{TL}$ depends on both the memory cell threshold voltages $V_{TM}$ and the cell transconductance $g_M$.

In the illustrative embodiment, sixteen sense amplifier/reference cells 16 are used with one logical threshold voltage $V_{TL}$ level being defined for each reference cell. In alternative embodiments, a fewer number of sense amplifier/reference cells 16 may be used. For example, a single memory cell can be programmed to four logical threshold voltage $V_{TL}$ values at each of four reference cell threshold voltages $V_{TR}$ so that sixteen levels are defined.

The variation of logical threshold voltage $V_{TL}$ is substantially linear with respect to reference cell threshold voltage $V_{TR}$ so that memory cell threshold voltage $V_{TM}$ is determined as a function of logical threshold voltage $V_{TL}$, reference cell threshold voltage $V_{TR}$, and transconductance $g_M$. The reference cell threshold voltage $V_{TR}$ and reference cell effective transconductance $g_M$ are measured during a test mode operation and saved for determination of memory cell threshold voltage $V_{TM}$ for scientific studies only.

Figure 6:
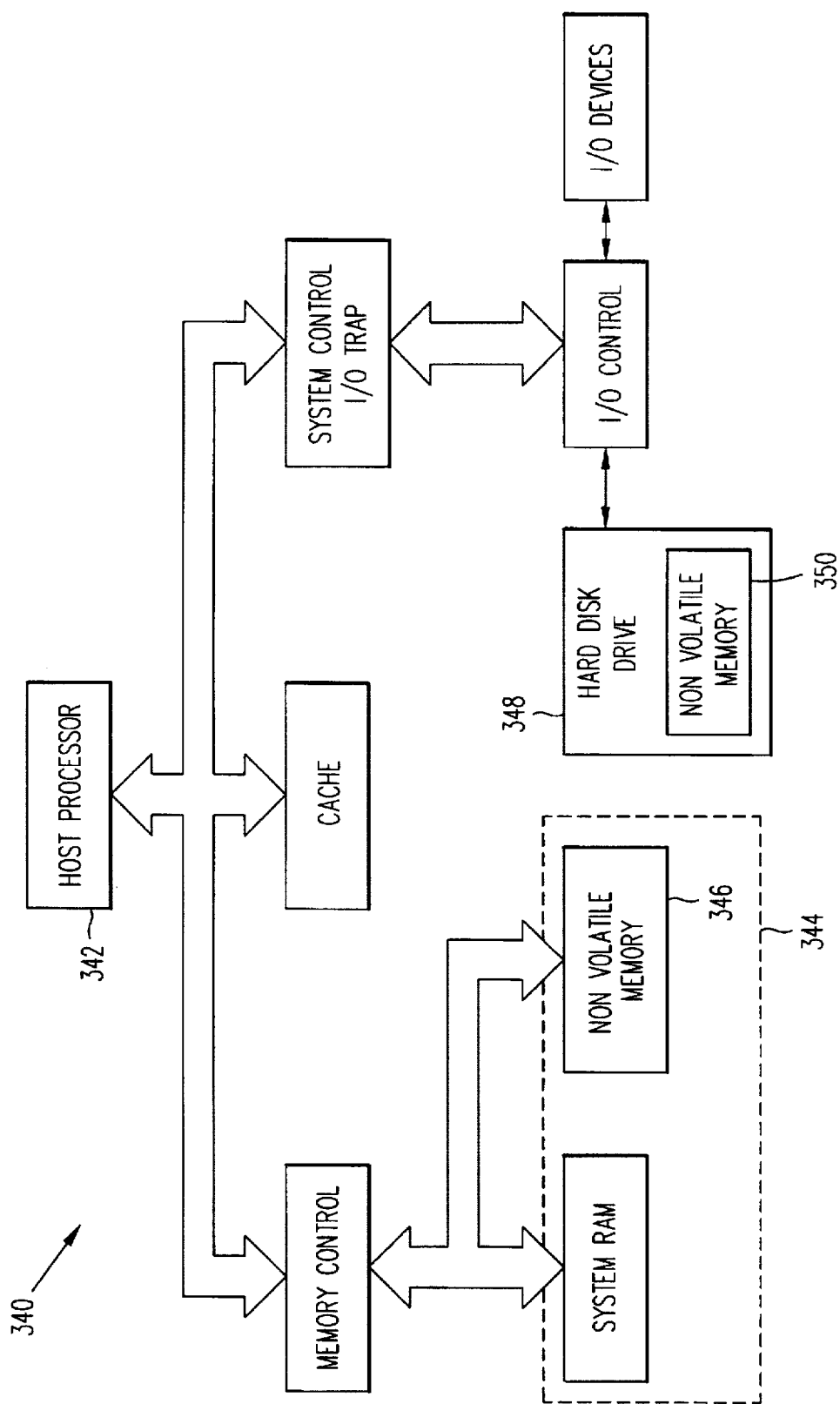
FIG. 6 is a high-level schematic block diagram illustrating a computer system in accordance with an embodiment of the present invention.

Referring to FIG. 6 a high-level schematic block diagram illustrates a computer system 340 including a host processor 342 such as an x86 processor. The host processor 342 executes programs based on instructions and data held in a system memory 344 including a nonvolatile memory 346. In other embodiments, the host processor 342 is connected to a hard drive storage 348 which may be composed of nonvolatile memories 350.

Figure 7:
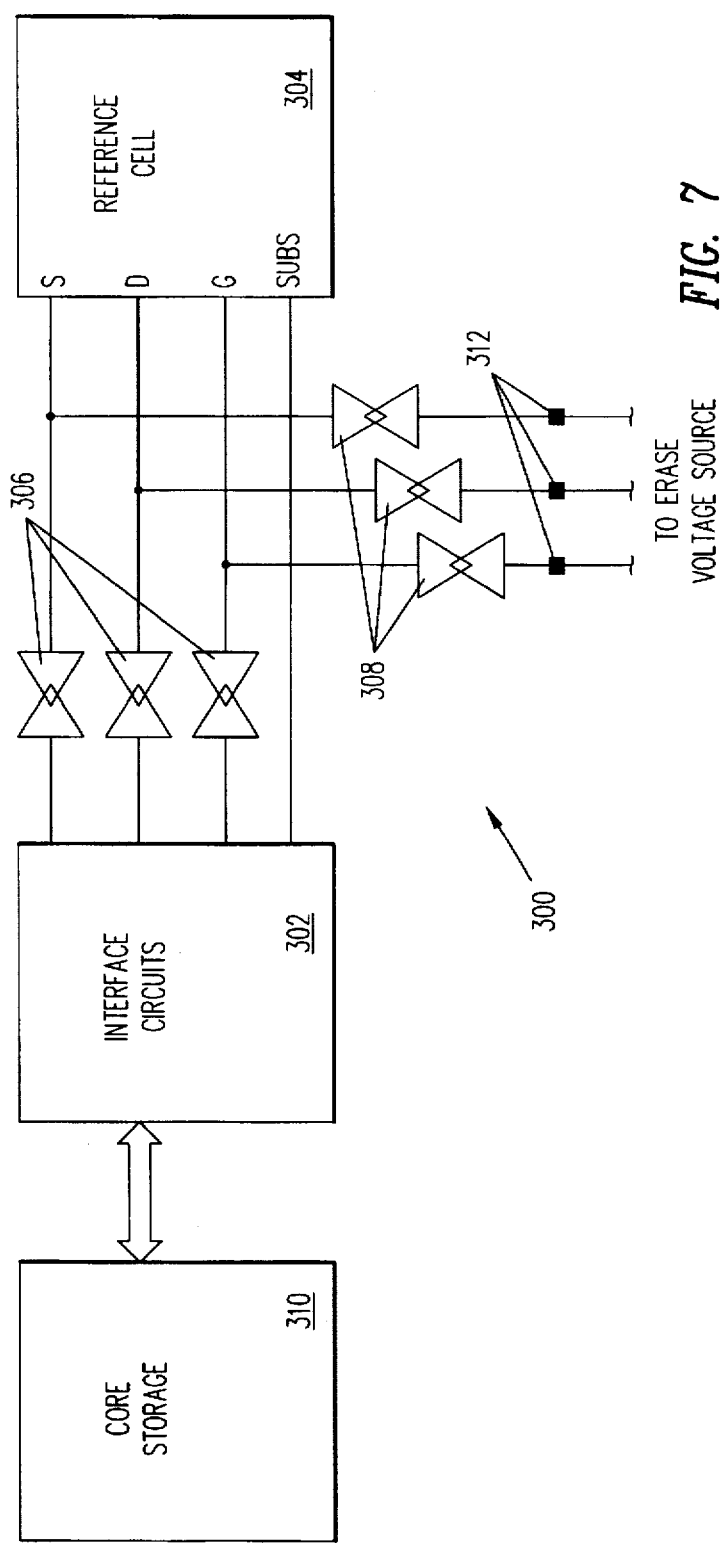
FIG. 7 is a schematic block diagram which illustrates a storage interface for storing multiple data bits in single storage cells of a memory using electrically-erasable reference cells.

Referring to FIG. 7, a schematic block diagram illustrates a storage interface 300 for storing multiple data bits in single storage cells of a memory. The storage interface 300 includes an interface circuits block 302, a reference cell block 304, a plurality of reference connecting switches 306, and a plurality of erase voltage switches 308. The interface circuits block 302 supplies connections to a core storage 310, which is external to the storage interface 300, and performs functions including decoding of addresses, forming appropriate switch connections for accessing memory, sensing of voltage levels of data in the core storage 310, and generation of timing signals for timing interactions between the core storage 310 and the interface circuits block 302. The reference cell block 304 includes a plurality of reference cell transistors (not shown) which set reference voltage levels for comparing to data in the core storage 310. The reference cell block 304 is connected to the storage interface 300 by lines connected to the transistors. In one embodiment, the transistors are MOS transistors and the reference cell block 304 is connected to the interface circuits block 302 by lines connected to the source, drain, gate and substrate terminals of the transistors. Accordingly, each reference cell in the reference cell block 304 serves as a nonvolatile bit allowing access to source, drain, gate, and substrate terminals of a transistor.

The core storage 310 is a nonvolatile storage such as EPROM, EEPROM or FLASH memory which is typically used as a media for mass storage. The storage interface 300 includes structures and functionality which improves the bit density of bit storage in the core storage 310, increasing the amount of bit storage per storage cell beyond the conventional one-bit per cell capacity. The core storage 310 includes multiple-level storage cells that advantageously increase the capacity of storage, reduces the memory per-bit cost, and reduces the circuit size for a given memory capacity.

Figure 8:
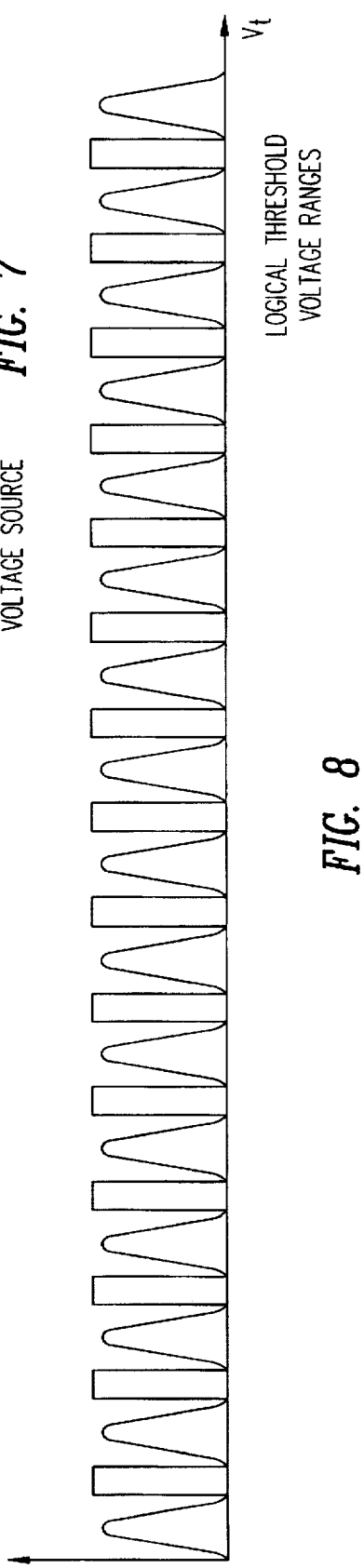
FIG. 8 is a graph which depicts an exemplary distribution of storage cell threshold voltage ranges for discrimination by the storage interface shown in FIG. 7.

In multilevel operation, a cell includes four bits of storage for a 16-level cell and eight bits of storage for a 256-level cell. Referring to FIG. 8, a graph depicts an exemplary distribution of storage cell threshold voltage ranges which are discriminated by the storage interface 300 and core storage 310. Threshold voltages of reference cells within the reference cell block 304 are positioned in separation regions between each of a plurality of single-level distributions during an initialization-program definition operation in which threshold voltages of reference cells within the reference cell block 304 are determined. In some embodiments, the threshold voltages are positioned at a lower threshold voltage ($V_T$) edge of the storage cell threshold voltage ranges.

During a memory program operation, the threshold reference cells are used to set the minimum voltage to program a cell. Programming of the memory cells of the core storage 310 is typically performed by applying a series of programming pulses to the memory cells of the core storage 310 to adjust the threshold voltage to a selected level. In the illustrative embodiment, during a memory read operation, a parallel data read operation is performed to distinguish a voltage between the multiple threshold ranges.

The interface circuits block 302 includes a plurality of differential amplifiers for sensing and comparing the reference and bit-line signals from a reference cell of the reference cell block 304 and from a bit-line of the core storage 310, respectively.

The reference connecting switches 306 and erase voltage switches 308 are implemented in one embodiment as transmission gates which either block a signal or allow a signal to pass. The reference connecting switches 306 selectively connect and disconnect the source, drain and gate lines of the interface circuits block 302 from the reference cell block 304. The erase voltage switches 308 selectively connect and disconnect the source, drain and gate lines of the reference cell block 304 from bonding pads 312 for connection to erase voltage sources. The reference connecting switches 306 and the erase voltage switches 308 are controlled to implement a reference erase mode of operation in which, when the reference erase mode signal is high, the storage interface 300 operates in a standard operating mode and the interface circuits block 302 is functionally connected to the reference cell block 304. When the reference erase signal is low, erase voltages are applied to the reference cell block 304 so that both positive and negative gate voltages are selectively supplied to erase the reference cells one cell at a time.

The reference connecting switches 306 and erase voltage switches 308 are controlled to precisely position the reference cells of the reference cell block 304. The reference cells are programmed to precise voltages to define voltage windows. The voltage windows of the reference cells are mutually adjusted to separate, nonoverlapping voltage ranges for a plurality of voltage ranges. For a storage interface 300 that supports storage of four bits per cell, sixteen separate, nonoverlapping voltage ranges are defined. For a storage interface 300 that supports storage of eight bits per cell, 256 separate, nonoverlapping voltage ranges are defined.

The programming of threshold voltages in the reference cell block 304 is highly predisposed to error. To define such a large number of ranges, the reference cells are programmed to a highly precise tolerance level so that the windows do not overlap. Precise programming is difficult since overshoot of the threshold voltage is common for each programmed reference cell. A suitable highly precise programming of the reference windows and, since each window of each circuit die is programmed, a suitable production yield is very difficult to achieve. The reference connecting switches 306 and erase voltage switches 308 are highly advantageous for allowing misprogrammed windows to be erased and correctly programmed to obtain nonoverlapping windows. A capability to erase and reprogram a reference cell is highly advantageous to compensate for programming overshoot. Usage of an electrically erasable reference cells allows reprogramming of each reference cell in the reference cell block 304 individually so that overshoot of the voltage of a single cell is corrected.

Figure 9:
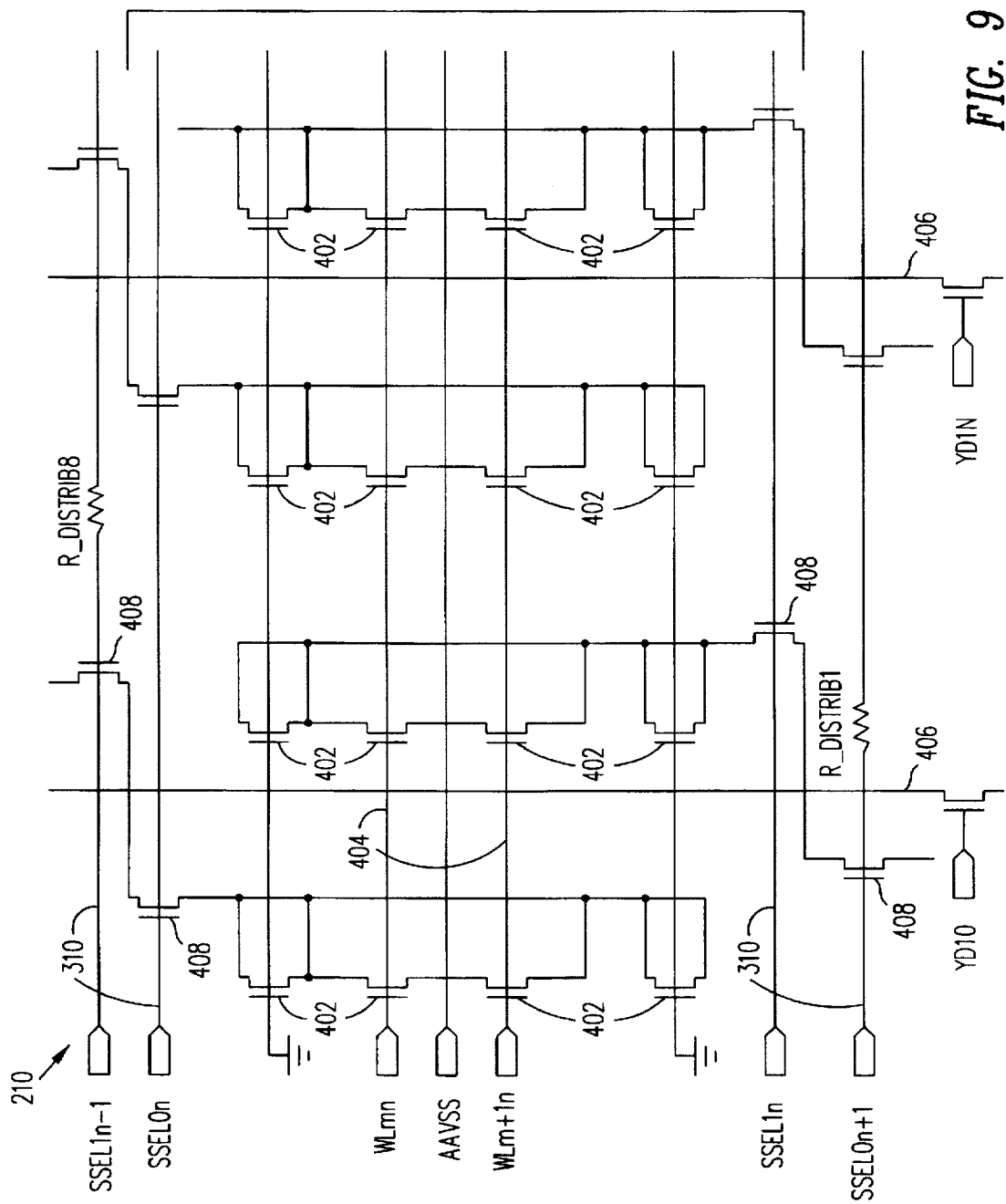
FIG. 9 is a schematic circuit diagram showing a portion of an array of storage cells in the core storage.

FIG. 9 is a schematic circuit diagram showing a portion of an array of storage cells in the core storage 310. The core storage 310 includes a plurality of storage nonvolatile MOSFET transistors 402 which are arranged in columns with each column including a plurality of transistors connected parallel to a bit line. A plurality of word lines 404 are connected to gate terminals of the transistors 402 so that a word line of the plurality word lines 404 connects to the gate terminals of transistors. Source and drain terminals of the storage MOSFET transistors 402 in a column are connected to form a bit-line of a plurality orbit-lines 406. The bit-lines 406 include an enable transistor 408 having a gate terminal connected to a sector select line 410. The sector select lines 410 include a polysilicon resistance R to more suitably match the RC time constant of a sector select line 410 to the RC time constant of the word lines 404.

Figure 10:
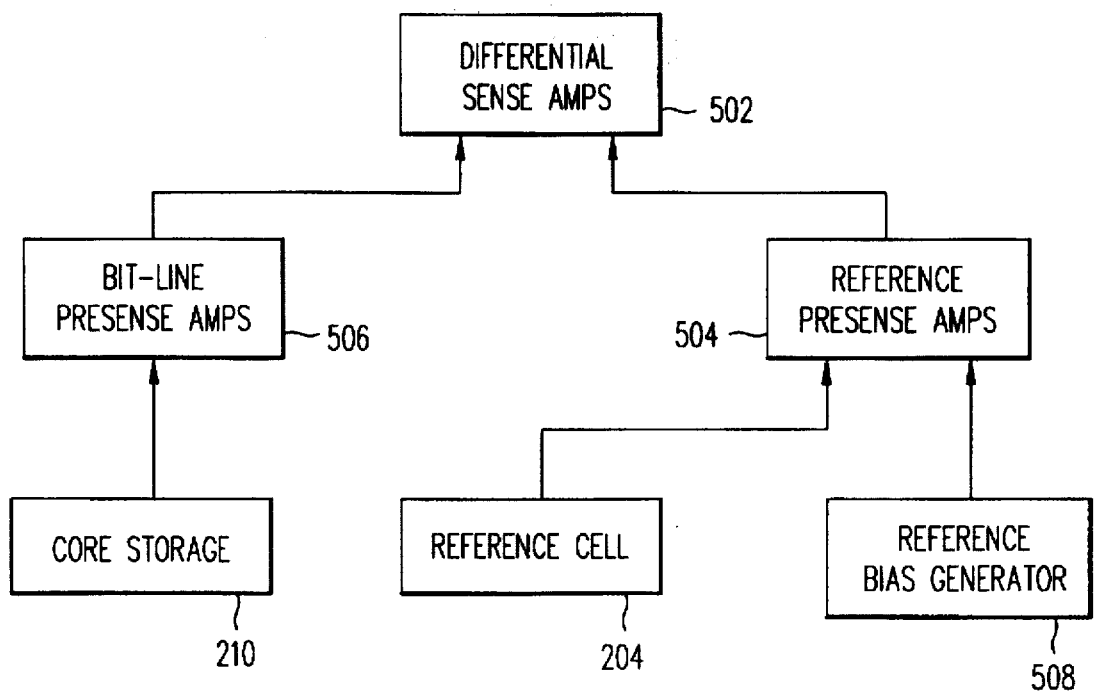
FIG. 10 is a schematic block diagram illustrating an embodiment of an interface circuit in the storage interface shown in FIG. 7.

Referring to FIG. 10, a schematic block diagram illustrates an embodiment of the interface circuits block 302. The interface circuits block 302 includes a plurality of differential sense amplifiers 502, a reference presense amplifier 504, an array of bit-line presense amplifiers 506, a reference bias generator 508. The individual differential sense amplifiers of the differential sense amplifiers 502 have a first input terminal connected to an output terminal of individual bit-line presence amplifiers of the array of bit-line presense amplifiers 506 and a second input terminal connected to an output terminal of a reference presense amplifier of the reference presense amplifier 504. Accordingly, the plurality of differential amplifiers 502 which are connected in series to sense a single reference cell of the reference cell block 304. The number of differential amplifiers is set according to the number of voltage levels to be stored within a single storage cells of a memory. For example, a four-level cell may use one or four differential amplifiers, a sixteen-level cell may use four or sixteen differential amplifiers, and a 256-level cell uses 64 or 256 differential amplifiers.

The differential sense amplifiers 502 are standard differential amplifiers which receive reference and bit-line signals from a reference cell of the reference cell block 304 and from a bit-line of the core storage 310, respectively. In one embodiment, the differential sense amplifiers 502 have a DC gain of 50 dB. A power-down signal line is connected to the differential sense amplifiers 502 to disable an amplifier to conserve DC current in power-down mode.

In one illustrative embodiment, the interface circuits block 302 includes a differential amplifier to distinguish each level of threshold voltage ($V_T$). In particular, an interface circuits block 302 for a 16-level, 4-bit storage interface 300 includes sixteen differential amplifiers and sets of associated bias circuits. An interface circuits block 302 for a 256-level, 8-bit storage interface 300 includes 256 individual differential amplifiers and sets of associated bias circuits.

In an alternative embodiment, an interface circuits block 302 includes a differential amplifier to distinguish each bit of the stored data using a binary search. An interface circuits block 302 which uses the binary search for a 16-level, 4-bit storage interface 300 includes four differential amplifiers and sets of associated bias circuits, and sixteen binary weighted reference cells. An interface circuits block 302 which uses the binary search for a 256-level, 8-bit storage interface 300 includes eight differential amplifiers and sets of associated bias circuits, and 256 binary weighted reference cells. Using the binary search technique, the threshold voltage ($V_T$) is first compared to a half-range reference cell voltages in a first step. In a second step, the threshold voltage ($V_T$) is compared to ¾ and ¼ range reference cell voltages in a second step, performing a binary search in subsequent steps. The binary search technique uses a smaller circuit area than the test of each level, but employs a longer test duration.

Figures 11, 11A:
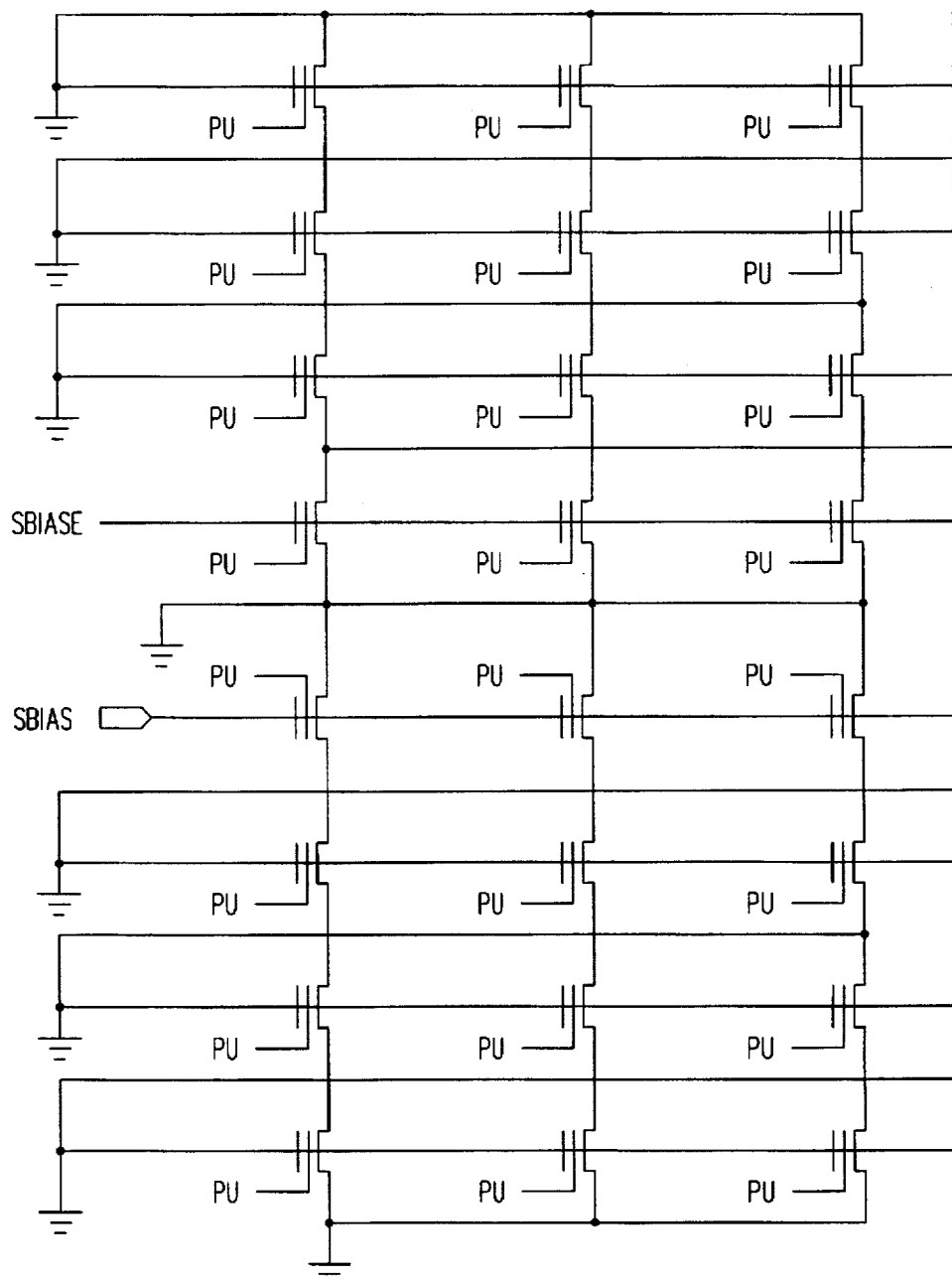
FIGS. 11, 11a–11c are is a schematic block diagram illustrating a portion of a reference array storage for usage with the storage interface shown in FIG. 7.
Figure 11B:
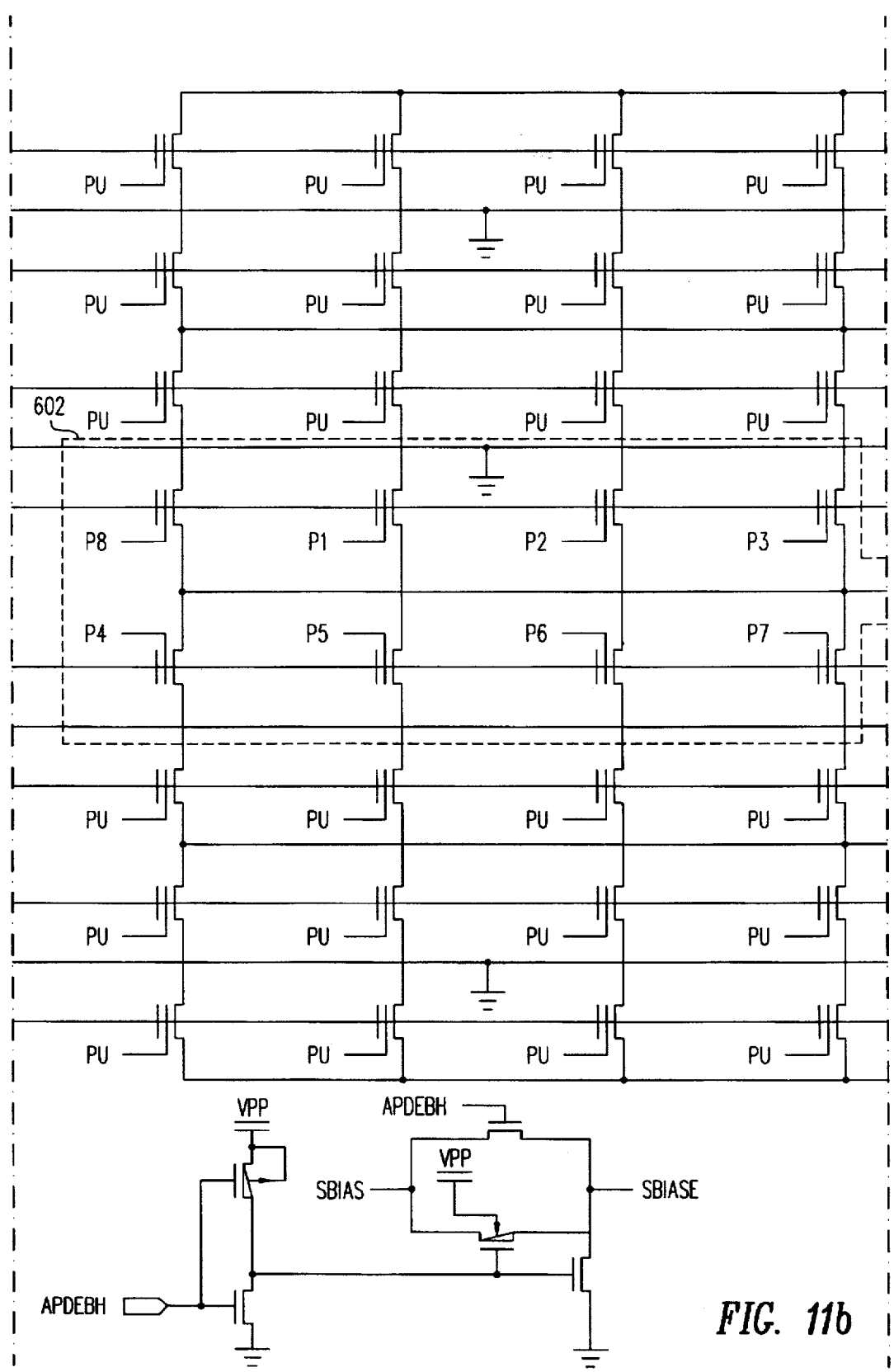
Figure 11C:
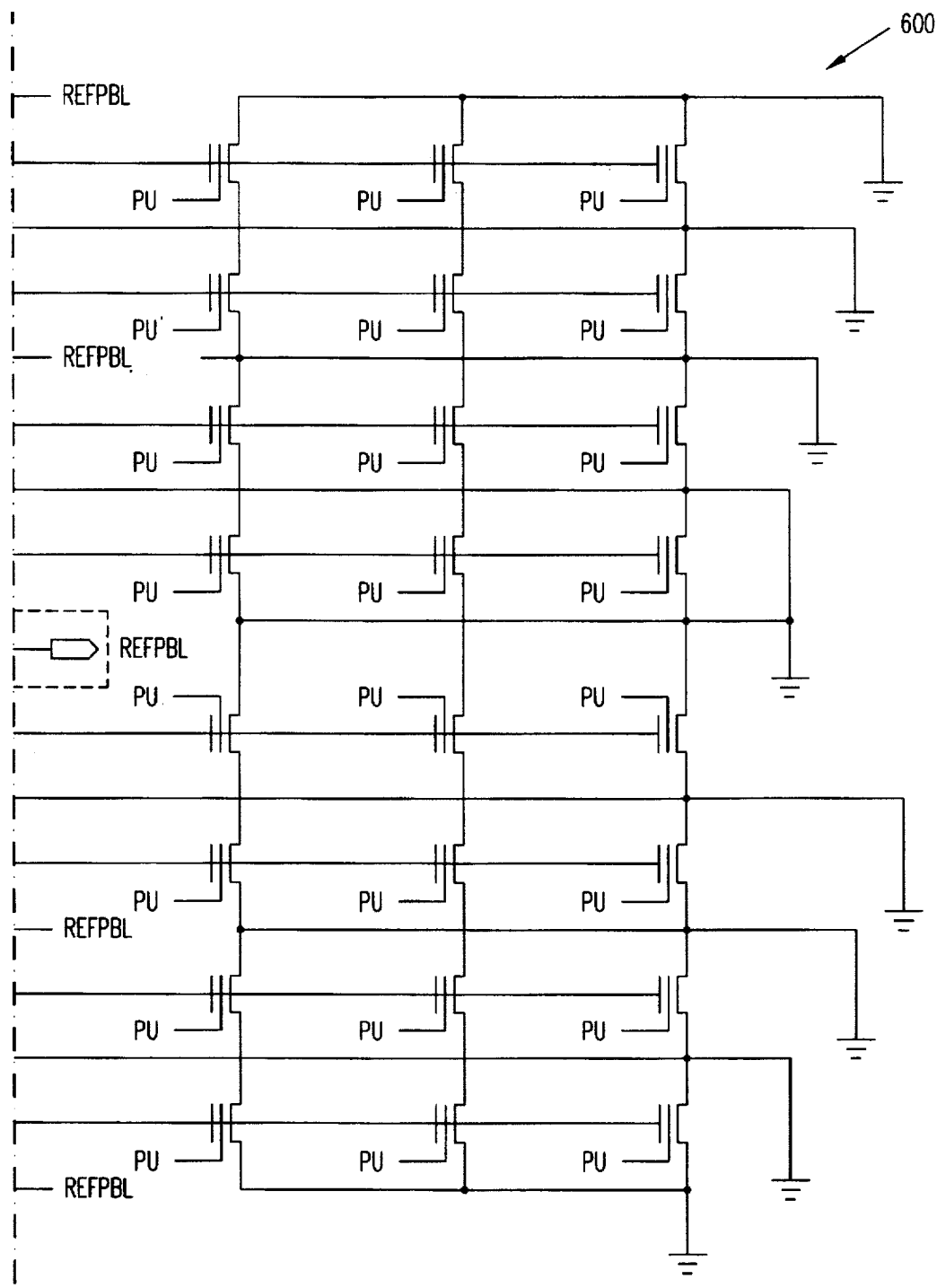

Referring to FIG. 11, a schematic block diagram illustrates a portion of a reference cell array 600 for a reference presense amplifier 504. The reference cell array 600 includes a plurality of MOSFET transistors arranged in an array of rows and columns. The reference cell array 600 is arranged in a plurality of active cells 602, one cell for each of the presense amplifiers. A bias voltage level signal is applied to the gates of the transistors in the active 602 and the active cell 602 generates a reference array gate voltage. The active cell 602 has an output terminal connected to a pulldown transistor 604. The pulldown transistor 604 has a gate terminal that is connected to receive a power-down select signal to ensure that the reference bit-line voltage consistently is initialized to a known value.

Figure 12:
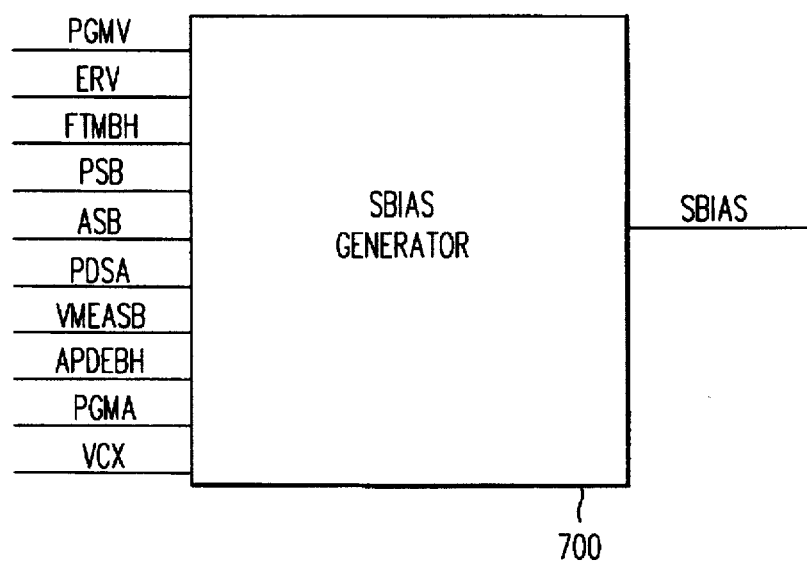
FIG. 12 is a schematic block diagram showing a bias circuit for supplying a reference array gate voltage.

The reference array gate voltage is supplied by a bias circuit 700, which is depicted in a schematic block diagram illustrated by FIG. 12. The bias circuit 700 generates a bias voltage signal for application to the gates of transistors in the reference cell array 600. The bias circuit 700 receives a program voltage control signals including an erase (ER) command, an erase and verify (ERV) command, a program verify (PGMV) command, a program read (PGMR) command, and a floor test mode (FTMBH) command. The bias circuit 700 is also The bias circuit 700 sets a voltage level of a bias voltage according to the applied command. The bias circuit 700 include a plurality of selectively sized transistors, including pullup and pulldown transistors, which are set active and inactive according to the selection of the program voltage control signals to generate a selected bias voltage. During an erase verify operation (ERV) of the storage interface 300, the bias voltage signal is set to VCC. For a read operation (PGMK), the bias voltage signal is set to a first defined fraction of VCC. During a program verify (PGMV) operation, the bias voltage signal is set to a second defined fraction of VCC. The different biases are applied to a reference cell of the reference cell array 600 to select a particular differential sensing mode. The selection of a differential sensing mode determines the threshold voltage $V_T$ of the reference cell.

Figure 13:
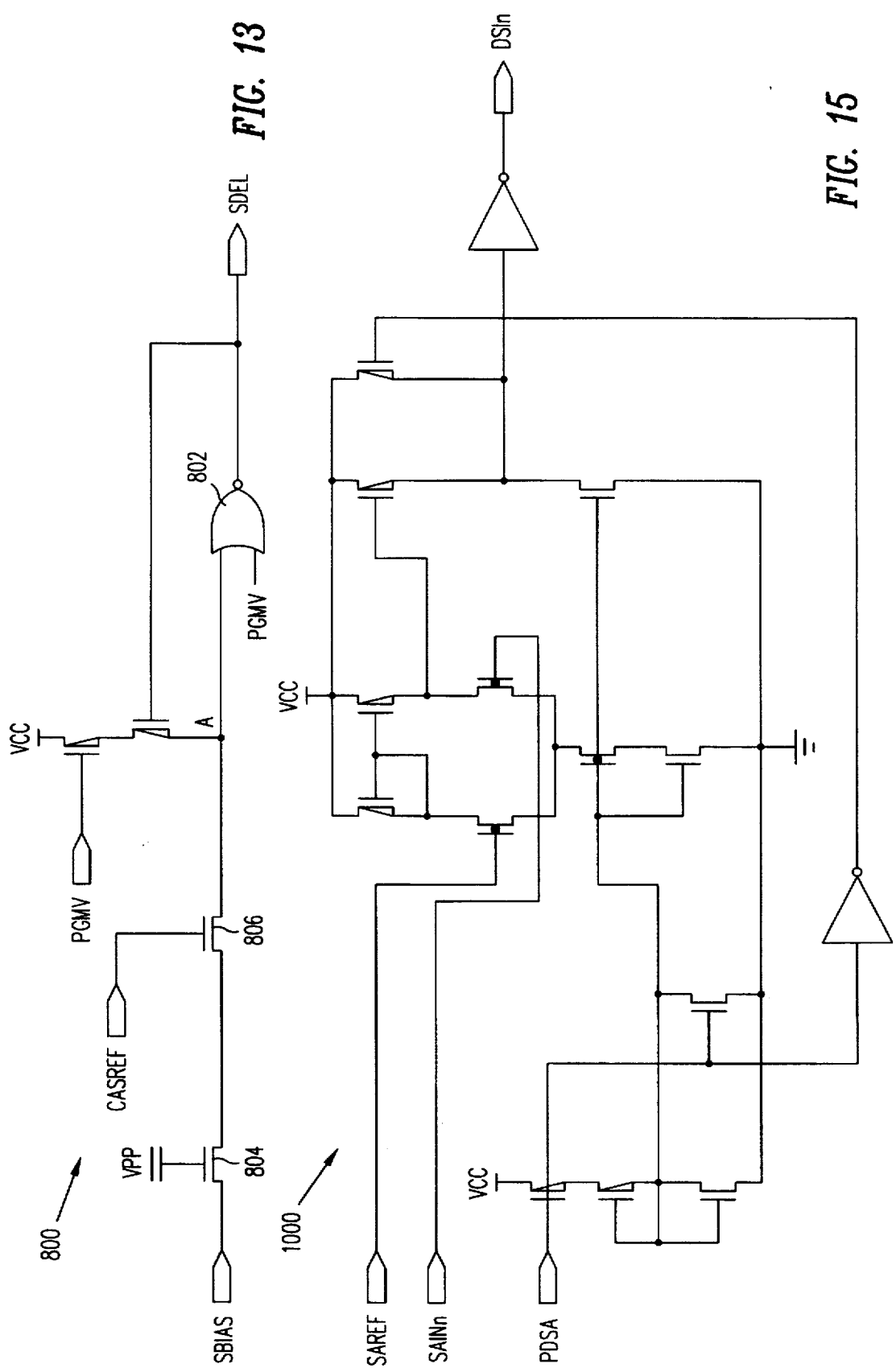
FIG. 13 is a schematic block diagram showing a reference array gate voltage delay circuit.

Referring to FIG. 13, a reference array gate voltage delay circuit 800 is inserted between the bias circuit 700 and the reference presense amplifiers 504 to delay the onset of activation of the reference presense amplifiers 504 until the reference presense amplifier array 700 is active. Insertion of the reference array gate voltage delay circuit 800 eliminates an output glitch during application of power to the storage interface 300. The reference array gate voltage delay circuit 800 is implemented by skewing the trip point of a NOR gate 802. P-channel pullup transistors 804 and 806 reduce the delay duration suitable for supplying charge to rapidly raise the bias voltage signal.

Figure 14:
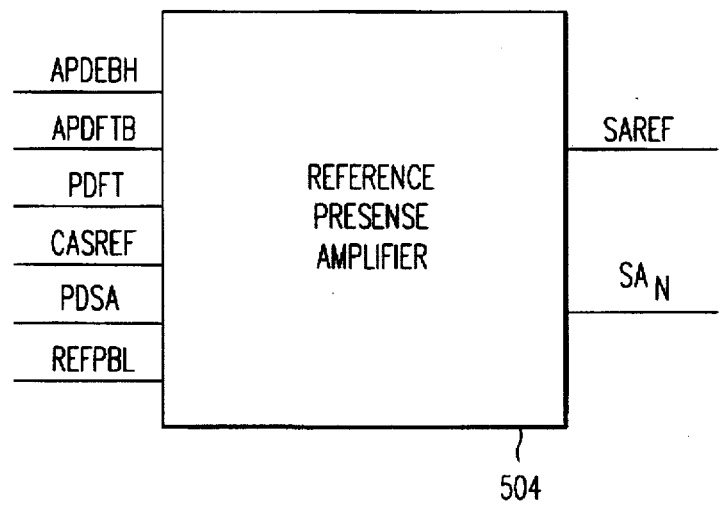
FIG. 14 is a schematic circuit diagram showing an amplifier of the reference presense amplifiers of the interface circuits shown in FIG. 10.

Referring to FIG. 14, a schematic circuit diagram shows an amplifier of the reference presense amplifiers 504. In the illustrative embodiment, the reference presense amplifier 504 is a cascode preamplifier which includes a pullup transistor, a pulldown transistor, and a plurality of presense load transistors. Transistors are sized to increase feedback speed, reduce overshoot, and reduce voltage swing on the output signal, thereby decreasing access time.

Referring to FIG. 15, a schematic block diagram illustrates a differential amplifier 1000 which is suitable for usage in the storage interface 300. The differential amplifier 1000 receives a first input signal from an amplifier of the reference presense amplifiers 504 and a second input signal from an amplifiers of the array of bit-line presense amplifiers 506 and generates a signal indicative of the difference between the input signals. The differential amplifier 1000 also receives a power-down signal to disable the amplifier during a power down mode of operation. Generally, an storage interface 300 includes a plurality of differential amplifiers 1000 for comparing the multiple levels of a storage cell in the core storage 310.

Figure 16:
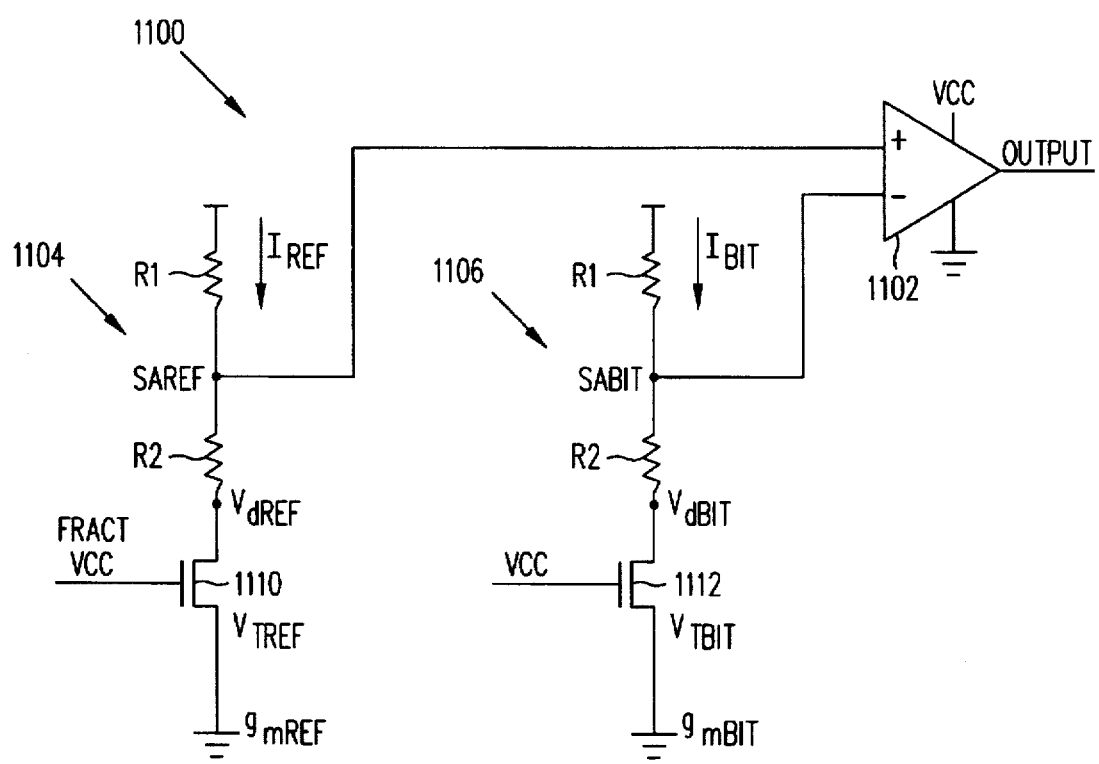
FIG. 16 is a schematic circuit diagram showing a simplified circuit model of the reference presense amplifier and a bit-line presense amplifier to facilitate understanding of an embodiment of the operating method of the present invention.

Referring to FIG. 16, a schematic circuit diagram shows a simplified circuit model of a differential amplifier 1102, a reference presense amplifier 1104, and a bit-line presense amplifier 1106 to facilitate understanding of an embodiment of the operating method of the present invention. A simplified circuit in the reference presense amplifier 1104 includes a first resistor R1 connected between a power supply VCC and a reference node SAREF, a second resistor R2 connected in series with the first resistor R1 at the reference node SAREF, and a transistor 1110 having a drain terminal connected to the second resistor R2, a source connected to ground, and a gate connected to receive a bias voltage. A current $I_{REF}$ conducts through the first resistor R1. The drain voltage of the transistor 1110 is $V_{dREF}$. The gate voltage of the transistor 1110 is a defined fraction of VCC. The threshold voltage of the transistor 1110 is the reference threshold voltage $V_{TREF}$. The transconductance of the transistor 1110 is $g_{mREF}$.

A simplified circuit in the bit-line presense amplifier 1106 includes a first resistor R1 connected between a power supply VCC and a bit-line node SABIT, a second resistor R2 connected in series with the first resistor R1 at the bit-line node SABIT, and a transistor 1112 having a drain terminal connected to the second resistor R2, a source connected to ground, and a gate connected to receive a bias voltage. A current $I_{BIT}$ conducts through the first resistor R1. The drain voltage of the transistor 1112 is $V_{dBIT}$. The gate voltage of the transistor 1112 is VCC. The threshold voltage of the transistor 1112 is the bit-line threshold voltage $V_{tBIT}$. The transconductance of the transistor 1112 is $g_{mBIT}$.

Typically the threshold voltage $V_T$ of a transistor is distributed between 2.5 volts and 5 or 6 volts. The threshold voltage $V_T$ is separated into a plurality of threshold voltage windows $\lambda V_T$, for example 16 or 256 windows. Achieving a suitable threshold voltage $V_T$ resolution or noise margin is difficult. The differential amplifier 1102 facilitates the resolution of threshold voltage windows $\lambda V_T$ by effectively expanding the voltage scale, typically by 10 or 12 times so that a 0.5 volt spread becomes an effective spread of about 6 volts. The differential amplifier 1102 thus improves the voltage resolution of a storage cell and improves signal to noise performance.

The differential amplifier 1102 determines the difference between the current in the reference cell $I_{REF}$ and the current in a cell of the core storage 310 $I_{BIT}$, by comparing the voltage at node SAREF to the voltage at node SABIT. Accordingly, the result of the access of a memory cell is determined by the threshold voltage $V_{TBIT}$ and transconductance $g_{mBIT}$ of the core storage element. If the current $I_{TBIT}$ is less than the current $I_{REF}$, then the output signal is low on the differential amplifier 1102. However, when the current $I_{BIT}$ is above the current $I_{REF}$, then the output signal of the differential amplifier 1102 is high.

Figure 17:
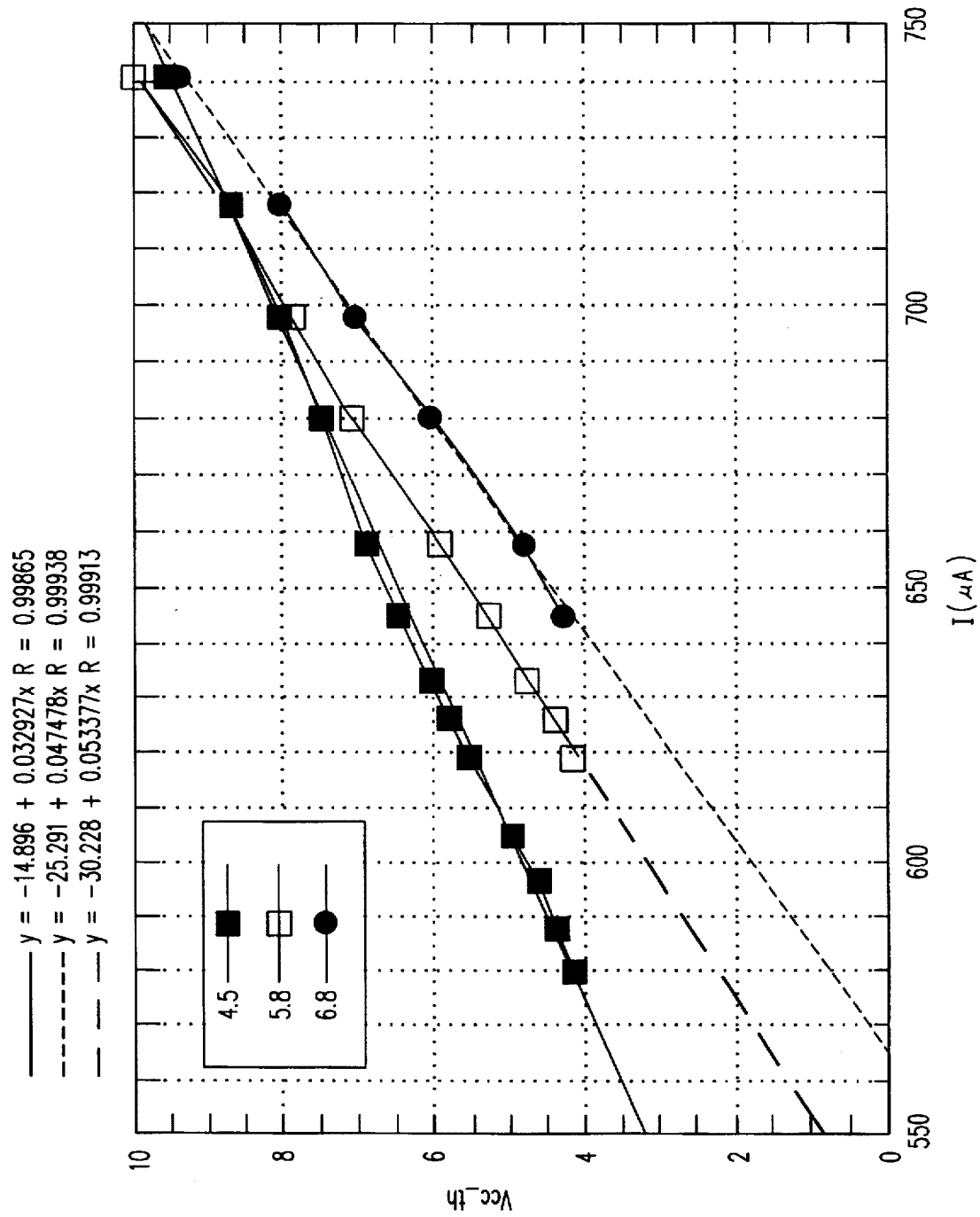
FIG. 17 is a graph illustrating a relationship between on-chip logical threshold voltage $V_T$ levels of three bits A, B and C with respect to the reference cell as the reference cell is programmed to lower $I_{DS}$ values.

Referring to FIG. 17, a graph illustrates a technique for programming a reference cell of the reference cell array 600. The VCC threshold voltage varies based on the programming of the reference cell. As a reference cell is programmed, the reference cell current $I_{REF}$ is decreased for a particular bit in a selected state and the VCC threshold of the bit drops within the magnified window as detected by the differential amplifier 1102. As the cell current $I_{BIT}$ of the storage cell rises above or falls below the window defined by the cell current $I_{REF}$ of the reference cell, the bit is no longer sensed.

Figure 18A:
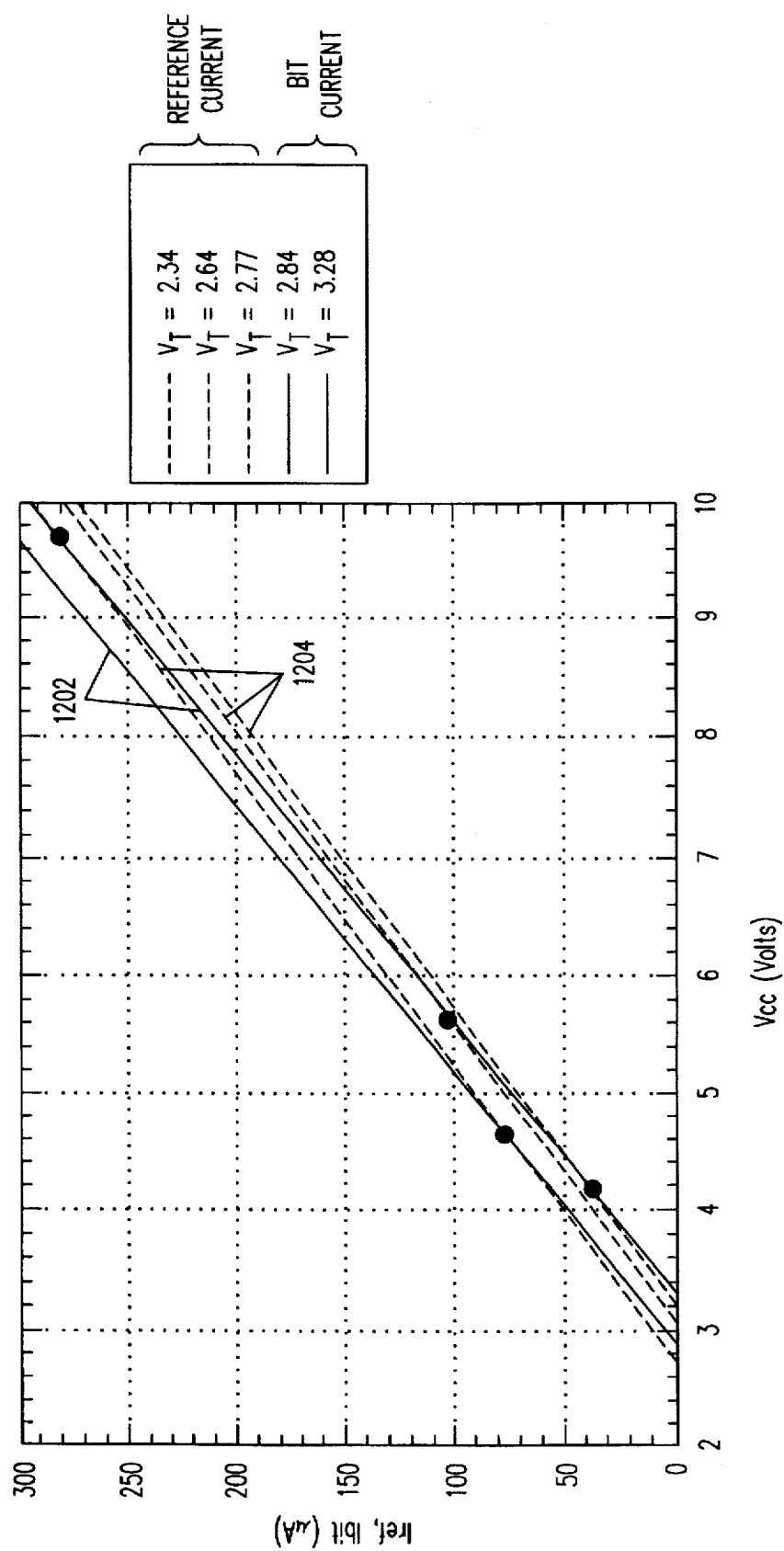
FIGS. 18A, and 18B are graphs which depict the operation of a sensing technique for sensing the threshold voltage $V_T$ level of a storage cell in comparison to a reference cell.
Figure 18B:
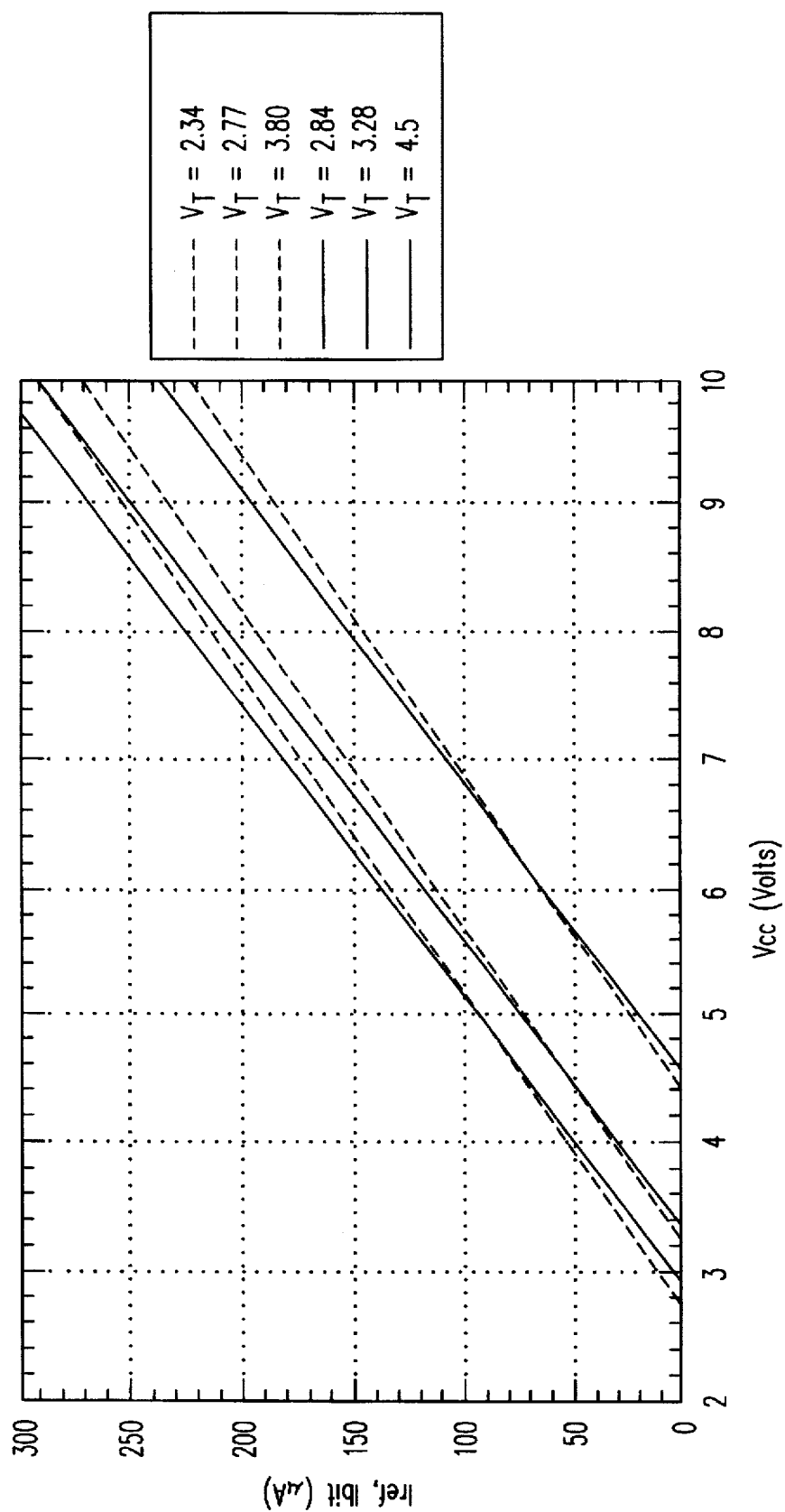

The differential amplifier 1102 is used to compare the threshold voltage $V_T$ of a storage cell in the core storage 310 to the threshold voltage $V_T$ of a reference cell having substantially the same layout as the storage cell in core storage 310. Referring to FIGS. 18A and 18B in conjunction with FIG. 16, sensing of multiple-levels for a single storage cell is performed using a relationship of cell current and voltage. The cell current and voltage are plotted graphically to show a threshold voltage $V_T$ line 1202 for the storage cell and threshold voltage $V_T$ line 1204 for the reference cell where the slope of the line corresponds to the transconductance $g_m$ of the cells.

The slope, and therefore the transconductance $g_m$, is set by the bias voltage applied to a reference cell of the reference cell array 600. If a smaller bias is applied, the slope and transconductance $g_m$ are reduced. Through selection of the bias, selection of a differential sensing mode determines the effective transconductance $g_{mREF}$ of the reference cell. The threshold voltage $V_T$ lines 1302 and 1304 intercept at a point, called a VCC threshold, in which the cell current $I_{BIT}$ of the storage cell is equal to the cell current $I_{REF}$ of the reference cell. The VCC threshold is typically monitored to detect the state of a bit when a differential amplifier is used to read a storage cell. When the cell current $I_{BIT}$ of the storage cell is less than the cell current $I_{REF}$ of the reference cell, the bit is in a first state. When the cell current $I_{BIT}$ of the storage cell reaches and exceeds the cell current $I_{REF}$ of the reference cell, the bit is in a second state. The differential amplifier 1102 receives the cell current $I_{BIT}$ of the storage cell at a first input terminal and receives the cell current $I_{REF}$ of the reference cell at a second input terminal. The differential amplifier 1102 detects small differences between the cell currents $I_{BIT}$ and $I_{REF}$ with high sensitivity and sets an output level of "0" or "1" depending on which cell current signal is larger.

Multiple bits of data are stored in a single storage cell by setting multiple different VCC thresholds in a single reference cell and comparing the threshold voltage $V_{TBIT}$ of the single storage cell to a plurality of cell currents $I_{REF}$ of the reference cell having different threshold voltages $V_{TREF}$. A typical operating voltage range of an integrated circuit is from 4 volts to 10 volts so that a conventional single bit of data is stored using a single VCC threshold of 4.5 volts, for example. The storage of multiple bits in a single storage cell is achieved by setting a plurality of VCC threshold voltages in a single reference cell. For example, four VCC threshold levels for a single cell may be set at 6, 7, 8, and 9 volts in a single reference cell, defining four states so that two bits of data are stored in a cell.

The number of bits stored in a single storage cell is increased much further by combining a plurality of reference cells for connection to the reference presense amplifier 1104. Accordingly, the reference cell block 304 shown in FIG. 7 includes a plurality of reference cells corresponding to a single storage cell in the core storage 310 with each reference cell including a plurality of VCC threshold voltages. For example, a nonvolatile storage for storing 16 levels is implemented using four reference cells with each reference cell designating four VCC threshold voltages. Typically each of the four reference cells includes the same VCC threshold levels but the different reference cells have different voltage offsets so that the VCC threshold levels of the reference cells correspond to different ranges. The usage of multiple reference cells is advantageous for improving the resolution of threshold voltage $V_T$ in a storage cell while sensing within the range of voltages that are normally applied to an integrated circuit.

In an alternative embodiment, the reference cells of the reference cell array 600 may be configured to select only a single VCC threshold voltage with multiple levels being selected for a storage cell by supplying a plurality of reference cells. For example, sixteen levels may be supplied using sixteen reference arrays, each of which designate only a single VCC threshold voltage.

Reference cells of the reference cell block 304 are programmed by applying a series of programming pulses to the memory cells of the reference cell block 304 to adjust the threshold voltage $V_T$ to selected values. The multiple VCC threshold voltages in each reference cell and for all reference cells are precisely programmed and tuned to a suitable value. The reference cells are electrically erasable to facilitate the precise tuning of the VCC threshold voltages. Referring to FIGS. 18A and 18B, changes to the programming of the reference cell shift the position of the $I_{REF}$/VCC lines so that slight changes may result in a substantial change in a VCC threshold intersection point. Also, overadjustment of a single VCC target voltage sometimes causes misalignment of many or all windows of a reference cell or multiple reference cells.

Variations in processing of integrated circuits are sufficient to cause large in errors in VCC threshold level for a multiple-level sensing scheme. Furthermore, due to the digital nature of programming of the reference cells, a desired target VCC threshold may not be achieved in some instances so that mutual reprogramming of the multiple VCC threshold voltages of the multiple reference cells is necessary to program nonoverlapping windows. Therefore, the reference cells are programmable and erasable so that the cells may be tuned to precisely define suitable VCC threshold voltages in a multiple-level sensing storage interface 300.

Figure 19:
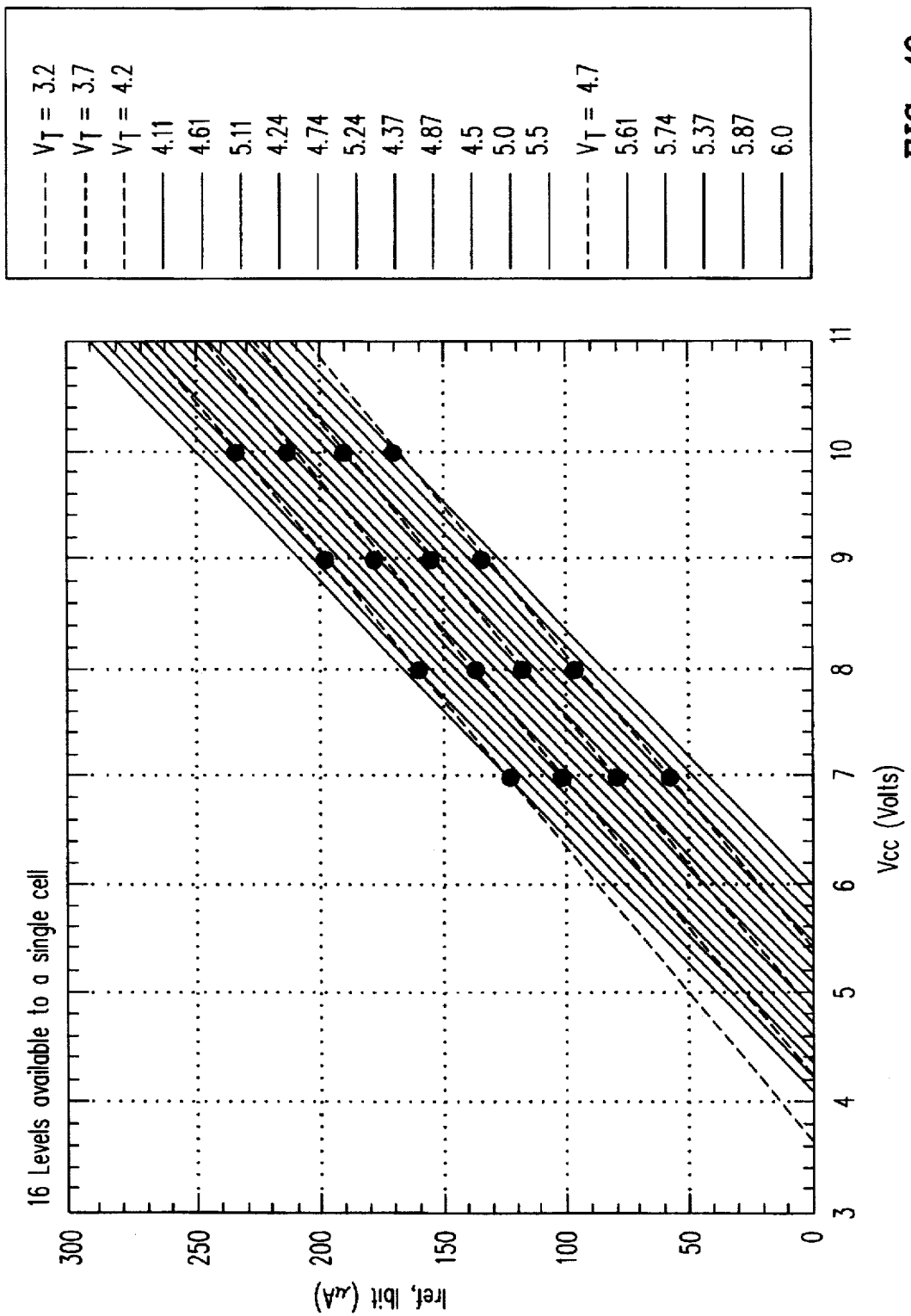
FIG. 19 is a graph showing an example of a correlation between VCC threshold voltages and threshold voltage $V_T$ for defining sixteen levels in a single storage cell.

Referring to FIG. 19, a graph illustrates an exemplary correlation between VCC threshold voltages and threshold voltage $V_T$ for defining sixteen levels in a single storage cell. Typically, the reference cell is programmed and fined-tuned using the electrically-erasable characteristic of the storage interface 300. The VCC thresholds are measured and the reference cells are programmed, erased if necessary, and fine-tuned to stack the reference voltage windows to define multiple states. TABLE I, as follows, tabulates the multiple threshold voltages $V_{TBIT}$ programmed for each of the four reference cells $V_{TS}$.

TABLE I

| Reference Cell 1 $V_T = 3.2$ V | Reference Cell 2 $V_T = 3.7$ V | Reference Cell 3 $V_T = 4.2$ V | Reference Cell 4 $V_T = 4.7$ V |
|---|---|---|---|
| 4.11 | | | |
| 4.24 | | | |
| 4.37 | | | |
| 4.50 | | | |
| | 4.61 | | |
| | 4.74 | | |
| | 4.87 | | |
| | 5.00 | | |
| | | 5.11 | |
| | | 5.24 | |
| | | 5.37 | |
| | | 5.50 | |
| | | | 5.61 |
| | | | 5.74 |
| | | | 5.87 |
| | | | 6.00 |

More stringent tolerance issues are raised for an storage interface 300 having higher multiples of VCC threshold voltages. For example, a storage interface 300 supplying 256 levels per storage cell typically includes programming of 8, 16 or 32 VCC threshold voltages in a single reference cell at a resolution of from 1/8 volt to 1/2 volt. Accordingly, the usage of electrically erasable reference cells is highly advantageous for programming multiple-level storage cells with a large number of levels, for example, 16 or more levels.

The usage of electrically erasable reference cells is also highly advantageous to improve the yield in manufacturing of memories. For example, if the programming of a single VCC threshold voltage is suitable in 90 percent of programmings, then a 16-level programming is suitable in only about twenty percent of the circuits and a 256-level programming is suitable in about three percent of the circuits.

Electrically erasable reference cells advantageously allow the storage interface 300 to be used in combination with a core storage of different types, models and manufacturers. Similarly, usage of electrically erasability of the reference cells permits utilization of different models or types of reference cell storage.

While the invention has been described with reference to various embodiments, it will be understood that these embodiments are illustrative and that the scope of the invention is not limited to them. Many variations, modifications, additions and improvements of the embodiments described are possible. The invention is defined by the appended claims in light of their full scope of equivalents. For example, the illustrative nonvolatile memory interface allocates sixteen or 256 levels for each memory cell of the nonvolatile memory. In other embodiments, fewer or more levels may be allocated for each memory cell, typically ranging from four levels (defining two bits) to a theoretically unlimited number of levels. The upper limit to the number of levels is determined by practical considerations such as circuit size which are unrelated to the limitations of the described invention.

What is claimed is:

1. A nonvolatile memory circuit comprising:

a nonvolatile memory array including a plurality of memory cells;

a plurality of decoders coupled to the nonvolatile memory array, the plurality of decoders for decoding addresses to the nonvolatile memory array;

a voltage controller coupled to the nonvolatile memory array, the voltage controller for controlling a programming voltage amplitude applied to the nonvolatile memory array;

a programming controller coupled to the plurality of decoders and coupled to the voltage controller, the programing controller for selecting a memory cell address, a nonvolatile memory array programming voltage amplitude, and a sensing mode signal;

a sense amplifier and reference cell coupled to the plurality of decoders for sensing a memory cell at a selected memory cell address of the plurality of memory cells in the nonvolatile memory array and coupled to the programming controller for receiving the sensing mode signal; and a level conversion circuit having an input terminal coupled to the sense amplifier and reference cell and having an output terminal coupled to the programming controller for communicating a level feedback signal.

2. A nonvolatile memory circuit according to claim 1 wherein the sense amplifier and reference cell further comprises:

a memory cell transistor having a gate coupled to a memory cell at a selected memory cell address of the plurality of memory cells in the nonvolatile memory array and a source drain pathway;

a reference cell transistor having a gate coupled to a reference cell and a source drain pathway;

a sense amplifier having a first input terminal coupled to the source drain pathway of the memory cell transistor, a second input terminal coupled to the source drain pathway of the reference cell transistor, and an output terminal coupled to the programming controller for communicating the level feedback signal; and a memory cell at a selected memory cell address of the plurality of memory cells in the nonvolatile memory array.

3. A nonvolatile memory circuit according to claim 1 wherein the sense amplifier and reference cell further comprises:

an electrically erasable and electrically programmable reference cell.

4. A nonvolatile memory circuit according to claim 1 further comprising:

a plurality of sense amplifier and reference cells coupled in parallel and coupled to the plurality of decoders for sensing a memory cell at a selected memory cell address of the plurality of memory cells in the nonvolatile memory array and coupled to the programming controller for receiving the sensing mode signal.

5. A nonvolatile memory circuit according to claim 4 further comprising:

an amplifier coupled between the plurality of decoders and the plurality of sense amplifier and reference cells.

6. A nonvolatile memory circuit according to claim 1 further comprising:

a plurality of sense amplifier and reference cells coupled in parallel, the sense amplifiers of the plurality of sense amplifier and reference cells for comparing a memory cell current from a memory cell of the plurality of memory cells to a reference cell current of the plurality of sense amplifier and reference cells, the reference cells being programmed to a plurality of different threshold voltage $V_T$ values.

7. A nonvolatile memory circuit according to claim 1 wherein:

the plurality of decoders include a plurality of column decoders and a plurality of row decoders; and the voltage controller includes a column voltage controller and a row voltage controller.

8. A nonvolatile memory circuit according to claim 1 wherein:

the nonvolatile memory array includes a plurality of single transistor memory cells, each memory cell having a word line and a bit line;

means for applying a positive voltage to a word line of an active memory cell to be read; and means for applying a negative voltage to a word line of an inactive memory cell not to be read.

9. A method of programming a nonvolatile memory cell in a nonvolatile memory array comprising the steps of:

programming a plurality of reference cells to a predetermined threshold voltage $V_T$, the plurality of references cells being connected in parallel;

initializing a nonvolatile memory cell in the nonvolatile memory array into an erased condition;

supplying a memory address and data voltage level for programming a nonvolatile memory cell of the nonvolatile memory array;

latching the supplied memory address and data voltage level;

decoding the latched memory address using row and column decoders;

generating a programming pulse at the latched data voltage level for application to a nonvolatile memory cell at the decoded memory address;

generating a read pulse for application to the nonvolatile memory cell at the decoded memory address;

sensing a source drain current $I_{DS}$ of the nonvolatile memory cell at the decoded memory address;

comparing the source drain current $I_{DS}$ of the nonvolatile memory cell at the decoded memory address to a reference cell of the plurality of reference cells connected in parallel; and generating an output level signal as a function of a result of the comparing step for the nonvolatile memory cell at the decoded memory address.

10. A method of programming a nonvolatile memory cell according to claim 9, wherein the initializing step further includes an erasing step selected from among the steps of ultra-violet (UV) erasing and electrical erasing.

11. A method of programming a nonvolatile memory cell according to claim 9, wherein the initializing step further includes a step of over-erasing the nonvolatile memory cell.

12. A method of programming a nonvolatile memory cell according to claim 9, further comprising a step of:

suppressing column leaking in the nonvolatile memory cell.

13. A method of programming a nonvolatile memory cell according to claim 9, further comprising a step of:

amplifying the source drain current $I_{DS}$ of the nonvolatile memory cell at the decoded memory address for comparison to a reference cell of a plurality of reference cells connected in parallel, the comparison dividing the source drain current $I_{DS}$ by a factor corresponding to the number of reference cells, the amplification restoring the source drain current $I_{DS}$ by the factor corresponding to the number of reference cells.

14. A method of programming a nonvolatile memory cell according to claim 9, further comprising a step of:

combining output level signals resulting from generating steps corresponding to a plurality of references cells;

converting the combined output level signals to a feedback voltage level signal; and adjusting the data voltage level for programming the nonvolatile memory cell of the nonvolatile memory array based on the feedback voltage level signal.

15. A nonvolatile memory circuit according to claim 9 wherein:

the plurality of memory cells includes a plurality of single transistor memory cells, each memory cell having a word line and a bit line;

applying a positive voltage to a word line of an active memory cell to be read; and applying a negative voltage to a word line of an inactive memory cell not to be read.

16. An electronic system including a microprocessor, a memory and a system bus comprising:

a nonvolatile memory circuit performing the method according to claim 9.

17. A computer system comprising:

a processor; and a nonvolatile memory coupled to the processor including:

a nonvolatile memory array including a plurality of individual nonvolatile memory cells, the individual nonvolatile memory cells storing at least three bits per cell;

a plurality of decoders coupled to the nonvolatile memory array, the plurality of decoders for decoding addresses to the nonvolatile memory array;

a voltage controller coupled to the nonvolatile memory array, the voltage controller for controlling a programming voltage amplitude applied to the nonvolatile memory array;

a programming controller coupled to the plurality of decoders and coupled to the voltage controller, the programming controller for selecting a memory cell address, a nonvolatile memory array programming voltage amplitude, and a sensing mode signal;

a sense amplifier and reference cell coupled to the plurality of decoders for sensing a memory cell at a selected memory cell address of the plurality of memory cells in the nonvolatile memory array and coupled to the programming controller for receiving the sensing mode signal; and a level conversion circuit having an input terminal coupled to the sense amplifier and reference cell and having an output terminal coupled to the programming controller for communicating a level feedback signal.

18. A computer system according to claim 17 wherein the sense amplifier and reference cell further comprises:

a memory cell transistor having a gate coupled to a memory cell at a selected memory cell address of the plurality of memory cells in the nonvolatile memory array and a source drain pathway;

a reference cell transistor having a gate coupled to a reference cell and a source drain pathway; and a sense amplifier having a first input terminal coupled to the source drain pathway of the memory cell transistor, a second input terminal coupled to the source drain pathway of the reference cell transistor, and an output terminal coupled to the programming controller for communicating the level feedback signal;

memory cell at a selected memory cell address of the plurality of memory cells in the nonvolatile memory array.

19. A computer system according to claim 17 wherein the sense amplifier and reference cell further comprises:

an electrically erasable and electrically programmable reference cell.

20. A computer system according to claim 17 further comprising:

a plurality of sense amplifier and reference cells coupled in parallel and coupled to the plurality of decoders for sensing a memory cell at a selected memory cell address of the plurality of memory cells in the nonvolatile memory array and coupled to the programming controller for receiving the sensing mode signal.

21. A computer system according to claim 20 further comprising:

an amplifier coupled between the plurality of decoders and the plurality of sense amplifier and reference cells.

22. A computer system according to claim 17 further comprising:

a plurality of sense amplifier and reference cells coupled in parallel, the sense amplifiers of the plurality of sense amplifier and reference cells for comparing a memory cell current from a memory cell of the plurality of memory cells to a reference cell current of the plurality of sense amplifier and reference cells, the reference cells being programmed to a plurality of different threshold voltage $V_T$ values.

23. A computer system according to claim 17 wherein:

the plurality of decoders include a plurality of column decoders and a plurality of row decoders; and the voltage controller includes a column voltage controller and a row voltage controller.

24. A computer system according to claim 17 wherein:

the nonvolatile memory array includes:

a plurality of single transistor memory cells, each memory cell having a word line and a bit line;

means for applying a positive voltage to a word line of an active memory cell to be read; and means for applying a negative voltage to a word line of an inactive memory cell not to be read.

25. A computer system according to claim 17 further comprising:

a disk drive storage coupled to the processor, the disk drive storage having a storage including the nonvolatile memory.

26. A computer system according to claim 17 wherein:

the individual nonvolatile memory cells store four bits per cell.

* * * * *